United States Patent
Weng et al.

(10) Patent No.: US 12,340,160 B2
(45) Date of Patent: *Jun. 24, 2025

(54) MEMORY CELL ARRAY CIRCUIT AND METHOD OF FORMING THE SAME

(71) Applicant: TAIWAN SEMICONDUCTOR MANUFACTURING COMPANY, LTD., Hsinchu (TW)

(72) Inventors: Chi-Hsiang Weng, Hsinchu (TW); Yu-Der Chih, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/448,117

(22) Filed: Aug. 10, 2023

(65) Prior Publication Data

US 2023/0394214 A1    Dec. 7, 2023

Related U.S. Application Data

(62) Division of application No. 17/504,805, filed on Oct. 19, 2021, now Pat. No. 11,922,108, which is a
(Continued)

(51) Int. Cl.
*G06F 30/392* (2020.01)
*G06F 30/39* (2020.01)
(Continued)

(52) U.S. Cl.
CPC ............ *G06F 30/392* (2020.01); *G06F 30/39* (2020.01); *G06F 30/394* (2020.01);
(Continued)

(58) Field of Classification Search
None
See application file for complete search history.

(56) References Cited

U.S. PATENT DOCUMENTS 7,260,442 B2    8/2007   Hwang et al.
8,159,870 B2    4/2012   Xia
(Continued)

FOREIGN PATENT DOCUMENTS

CN       101925961       12/2010
CN       105304126       2/2016
(Continued)

*Primary Examiner* — Hung K Vu
(74) *Attorney, Agent, or Firm* — Hauptman Ham, LLP

(57) ABSTRACT

A memory cell array includes a first and a second column of memory cells, a first and a second bit line, a source line and a first set of vias. The second bit line includes a first conductive line located on a first metal layer, and a second conductive line located on a second metal layer. The first and second conductive lines overlap a source of a transistor of a memory cell of the second column of memory cells. The source line is coupled to the first and second column of memory cells. The first set of vias is electrically coupled to the first and second conductive line. A pair of vias of the first set of vias is located above where the first conductive line overlaps each memory cell of the second column of memory cells.

20 Claims, 19 Drawing Sheets

Related U.S. Application Data division of application No. 16/401,486, filed on May 2, 2019, now Pat. No. 11,151,296.

(60) Provisional application No. 62/673,786, filed on May 18, 2018.

(51) Int. Cl.
| | |
|---|---|
| *G06F 30/394* | (2020.01) |
| *G11C 13/00* | (2006.01) |
| *H10B 61/00* | (2023.01) |
| *H10B 63/00* | (2023.01) |
| *H10B 69/00* | (2023.01) |
| *H10N 70/00* | (2023.01) |

(52) U.S. Cl.
CPC ........... *G11C 13/003* (2013.01); *H10B 61/22* (2023.02); *H10B 63/30* (2023.02); *H10B 63/80* (2023.02); *H10B 69/00* (2023.02); *G11C 2213/79* (2013.01); *H10N 70/826* (2023.02); *H10N 70/841* (2023.02)

(56) References Cited

U.S. PATENT DOCUMENTS

| | | | |
|---|---|---|---|
| 8,395,922 | B2 | 3/2013 | Noguchi |
| 8,411,488 | B2 | 4/2013 | Kawabata et al. |
| 9,256,709 | B2 | 2/2016 | Yu et al. |
| 9,355,725 | B2 | 5/2016 | Jin et al. |
| 11,151,296 | B2 * | 10/2021 | Weng ..................... H10B 63/80 |
| 2007/0114606 | A1 * | 5/2007 | Hoshino ............. H01L 29/7835 |
| | | | 257/E29.054 |
| 2014/0040838 | A1 | 2/2014 | Liu et al. |
| 2015/0278429 | A1 | 10/2015 | Chang |
| 2017/0117042 | A1 * | 4/2017 | Lee ....................... G11C 11/161 |

FOREIGN PATENT DOCUMENTS

| | | |
|---|---|---|
| CN | 105518797 | 4/2016 |
| CN | 106898611 | 6/2017 |
| CN | 107533859 | 1/2018 |

\* cited by examiner

MEMORY CELL ARRAY CIRCUIT AND METHOD OF FORMING THE SAME

PRIORITY CLAIM AND CROSS-REFERENCE

This application is a divisional of U.S. application Ser. No. 17/504,805, filed Oct. 19, 2021, now U.S. Pat. No. 11,922,108, issued Mar. 5, 2024, which is a divisional of U.S. Application No. 16/401,486, filed May 2, 2019, now U.S. Pat. No. 11,151,296, issued Oct. 19, 2021, which claims the benefit of U.S. Provisional Application No. 62/673,786, filed May 18, 2018, which are herein incorporated by reference in their entireties.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices are also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
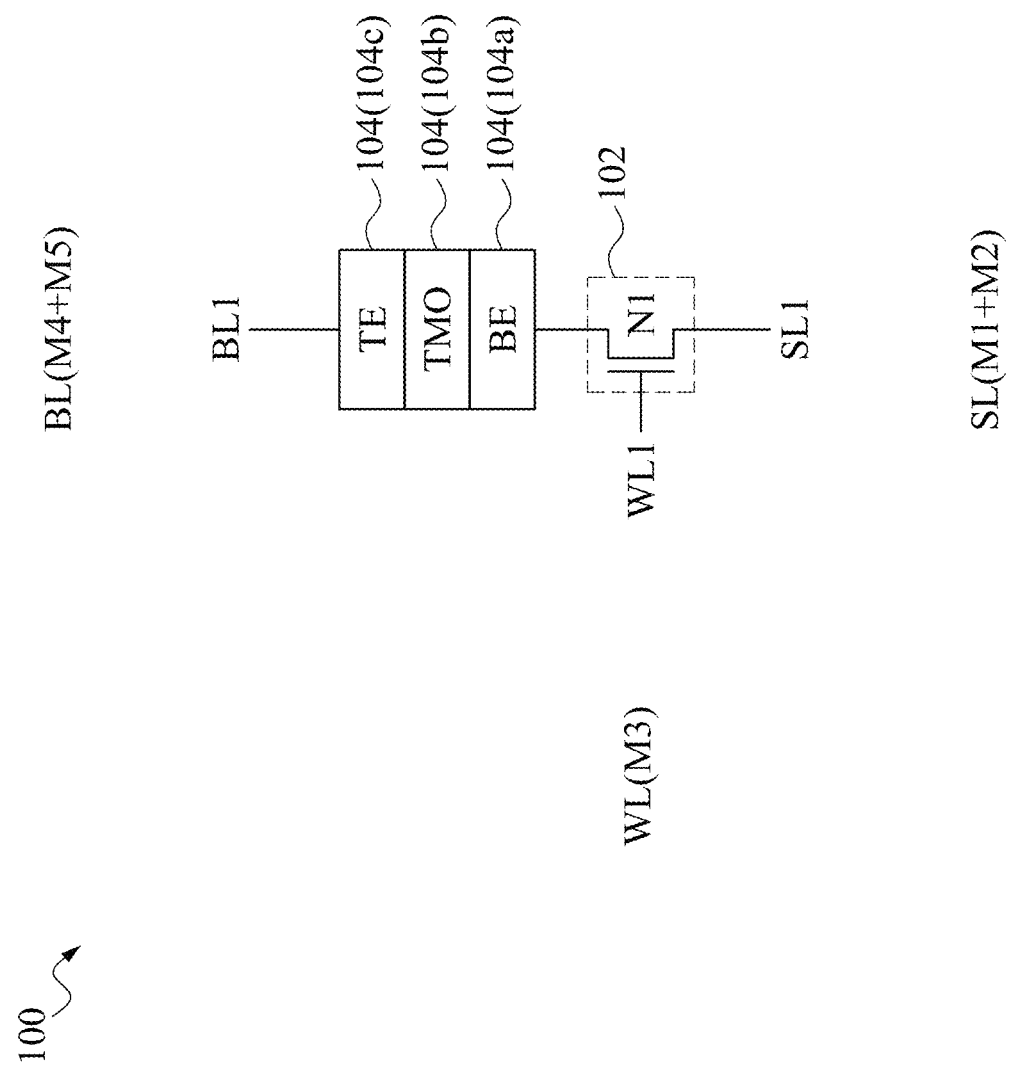
FIG. 1 is a circuit diagram of a memory cell, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory cell array includes a first column of memory cells, a second column of memory cells, a first bit line, a second bit line and a source line. The second column of memory cells is separated from the first column of memory cells in a first direction. The first column of memory cells and the second column of memory cells are arranged in a second direction different from the first direction. The first bit line is coupled to the first column of memory cells, and extends in the second direction. The second bit line is coupled to the second column of memory cells, and extends in the second direction. The source line extends in the second direction, is coupled to the first column of memory cells and the second column of memory cells, and is shared by the first column of memory cells and the second column of memory cells.

In some embodiments, the source line includes a first conductive line extending in the second direction, and being located on a first metal layer. In some embodiments, the source line further includes a second conductive line and a set of vias. In some embodiments, the second conductive line extends in the second direction, and is located on a second metal layer above the first metal layer. In some embodiments, the set of vias electrically couple the first conductive line and the second conductive line.

In some embodiments, a resistance of the first bit line or a resistance of the second bit line is substantially equal to a resistance of the source line.

In some embodiments, the first or second bit line includes a third conductive line extending in the second direction, and being located on a third metal layer. In some embodiments, the first or second bit line further includes a fourth conductive line and another set of vias. In some embodiments, the fourth conductive line extends in the second direction, and is located on a fourth metal layer above the third metal layer. In some embodiments, the another set of vias electrically couple the third conductive line and the fourth conductive line.

In some embodiments, memory cell array includes source lines SL shared by adjacent columns of memory cells causing a decrease in the number of source lines and corresponding routing tracks than other approaches. In some embodiments, by having less source lines and corresponding routing tracks, the width of source lines and corresponding routing tracks in the memory cell array is increased resulting in less source line resistance than other approaches. In some embodiments, by having less source line resistance, a difference between the source line resistance and bit line resistance is smaller than other approaches. In some embodiments, by having a smaller difference between source line resistance and bit line resistance than other approaches results in simpler peripheral circuitry for reading and writing to memory cell array.

Memory Cell

FIG. 1 is a circuit diagram of a memory cell 100, in accordance with some embodiments.

Memory cell 100 is a resistive random access memory (RRAM) cell used for illustration. Other types of memory are within the scope of various embodiments. For example, in some embodiments, memory cell 102 includes a ferroelectric RAM (F-RAM), a Magnetoresistive RAM (MRAM), Phase-change memory (PCM), other forms of non-volatile RAM cells, or the like. Memory cell 100 is configured to store a logic "1" or a logic "0" based on the resistance the memory cell.

Memory cell 100 comprises a selector element (SE) 102 and a resistive switching element (RE) 104. In some embodiments, memory cell 100 is referred to as a "1T1R" (one transistor, one resistor) architecture. In some embodiments, memory cell 100 employs a number of transistors or resistive elements other than one.

Selector element 102 is an N-type metal oxide semiconductor (NMOS) transistor N1. In some embodiments, selector element 102 is a P-type metal oxide semiconductor (PMOS) transistor. Other types of transistors or numbers of transistors in selector element 102 are within the contemplated scope of the present disclosure. In some embodiments, selector element 102 includes one or more diode elements or diode coupled transistors. In some embodiments, selector element 102 includes one or more elements capable of exhibiting switching behavior or function.

A gate terminal of NMOS transistor N1 is coupled to a word line WL1, and is configured to receive a word line signal (not labelled). A drain terminal of NMOS transistor N1 is coupled with resistive switching element 104. A source terminal of NMOS transistor N1 is coupled to a source line SL1, and is configured to output/receive a source line signal (not labelled) to/from the source line SL1. In some embodiments, the source terminal of NMOS transistor N1 is coupled to resistive switching element 104, and the drain terminal of NMOS transistor N1 is coupled to the source line SL1.

Resistive switching element 104 includes a bottom electrode 104a, a resistive switching material 104b, and a top electrode 104c. Resistive switching element 104 is configured to store a logic "1" or a logic "0" based on a variable resistance of the resistive switching material 104b. In some embodiments, the resistance of the resistive switching material 104b is adjusted based on at least a voltage applied to the word line WL1, bit line BL1 or source line SL1.

Bottom electrode (BE) 104a is coupled to the drain of NMOS transistor N1. Top electrode (TE) 104c is coupled to the bit line BL1. BE 104a and TE 104c are conductive structures. In some embodiments, a conductive structure includes a metal, a metal compound or a doped semiconductor. In some embodiments, a metal includes at least Cu (Copper), Co, W, Ru, Al, or the like. In some embodiments, a metal compound includes at least AlCu, W—TiN, TiSix, NiSix, TiN, TaN, or the like. In some embodiments, a doped semiconductor includes at least doped silicon, or the like.

Resistive switching material 104b is positioned between BE 104 and TE 104c. In some embodiments, resistive switching material 104b is a dielectric material having one or more layers. In some embodiments, dielectric materials include one or more transition metal oxides (TMO). In some embodiments, TMOs include at least one selected from the group consisting of HfOx, TaOx, TiOx, AlOx, CuOx, NiOx, WOx, mixtures thereof, and alloys thereof. In some embodiments, dielectric materials include one or more binary oxides. In some embodiments, binary oxides include at least one selected from the group consisting of VOx, CrOx, MnOx, FeOx, CoOx, ZnOx, YOx, ZrOx, NbOx, MoOx, RuOx, AgOx, SiOx, CeOx, mixtures thereof, and alloys thereof. In some embodiments, dielectric materials include one or more ternary oxides. In some embodiments, ternary oxides include at least one selected from the group consisting of SrZrOx, SrTiOx, mixtures thereof, and alloys thereof. In some embodiments, dielectric materials include one or more quaternary oxides. In some embodiments, quaternary oxides include at least one selected from the group consisting of $Cd_mCe_nFe_xO_y$, mixtures thereof, and alloys thereof.

In some embodiments, the resistive switching material 104b is changed from a low resistance state, known as a "Set," to a high resistance state, known as a "Reset," and vice versa.

In some embodiments, the resistive switching material 104b is "Set" by applying at least a voltage to a corresponding word line WL1, bit line BL1 or source line SL1 such that a filament or conduction path through the resistive switching material 104b is formed or re-formed.

In some embodiments, the resistive switching material 104b is "Reset" by applying at least a voltage to a corresponding word line WL1, bit line BL1 or source line SL1 such that the filament or conduction path through the resistive switching material 104b is broken.

Memory Cell Array

Figure 2:
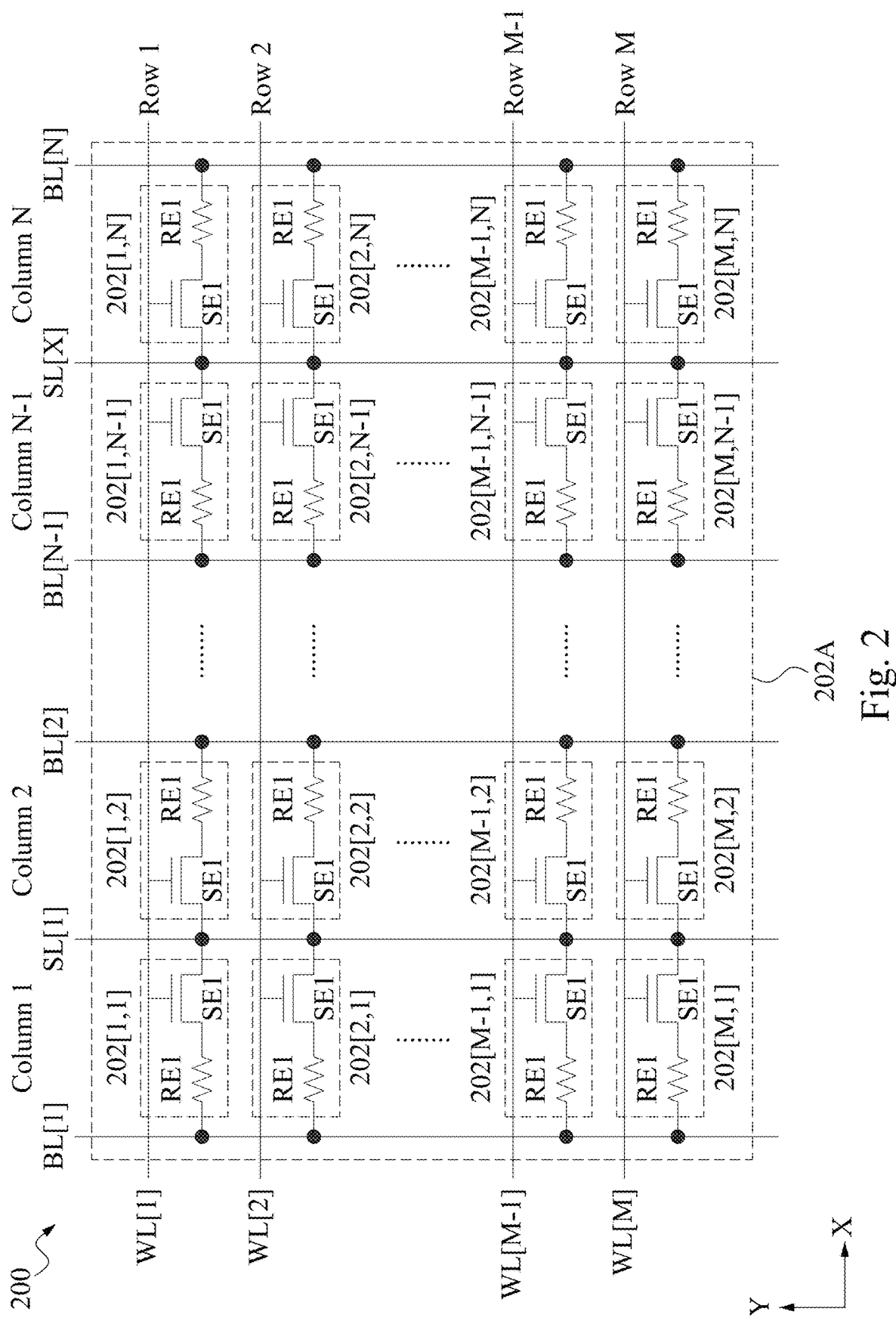
FIG. 2 is a block diagram of a memory cell array having a plurality of memory cells in FIG. 1, in accordance with some embodiments.

FIG. 2 is a block diagram of a memory cell array 200 having a plurality of memory cells in FIG. 1, in accordance with some embodiments. For example, memory cell 100 of FIG. 1 is usable as one or more memory cells in memory cell array 200.

Memory cell array 200 comprises an array of memory cells 202[1,1], 202[1,2], . . . , 202[2,2], . . . , 202[M,N] (collectively referred to as "array of memory cells 202A") having M rows and N columns, where N is a positive integer corresponding to the number of columns in array of memory cells 202A and M is a positive integer corresponding to the number of rows in array of memory cells 202A. The rows of cells in array of memory cells 202A are arranged in a first direction X. The columns of cells in array of memory cells 202A are arranged in a second direction Y. The second direction Y is different from the first direction X. In some embodiments, the second direction Y is perpendicular to the first direction X. Memory cell 100 of FIG. 1 is usable as one or more memory cells in array of memory cells 202A.

Each memory cell 202[1,1], 202[1,2], . . . , 202[2,2], . . . , 202[M,N] in array of memory cells 202A includes a corresponding resistive switching element RE1 coupled to a corresponding selector element SE1. Resistive switching element 104 of FIG. 1 is usable as one or more resistive switching elements RE1 in memory cell array 200, and similar detailed description is therefore omitted. Selector element 102 of FIG. 1 is usable as one or more selector elements SE1 in memory cell array 200, and similar detailed description is therefore omitted.

Different types of memory cells in memory cell array 200 are within the contemplated scope of the present disclosure. Different configurations of array of memory cells 202A are within the contemplated scope of the present disclosure. Different configurations of bit lines BL, word lines WL or source lines SL in array of memory cells 202A are within the contemplated scope of the present disclosure. Furthermore, in some embodiments, array of memory cells 202A includes multiple groups of different types of memory cell.

Memory cell array 200 further includes M word lines WL[1], ... WL[M] (collectively referred to as "word line WL"). Each row 1, ..., M in array of memory cells 202A is associated with a corresponding word line WL[1], ..., WL[M]. Each word line WL extends in the first direction X. One or more of the word lines of the set of word lines WL in array of memory cells 202A corresponds to the word line WL1 of FIG. 1.

Memory cell array 200 further includes N bit lines BL[1], ... BL[N] (collectively referred to as "bit line BL"). Each column 1, ..., N in array of memory cells 202A is associated with a corresponding bit line BL[1], ..., BL[N]. Each bit line BL extends in the second direction Y. One or more bit lines of the set of bit lines BL in array of memory cells 202A corresponds to bit line BL1 of FIG. 1.

Memory cell array 200 further includes X source lines SL[1], ... SL[X] (collectively referred to as "source line SL"), where X is a positive integer corresponding to the number of source lines. In some embodiments, for an even number of columns N in array of memory cells 202A, integer X is equal to N/2. In some embodiments, for an odd number of columns N in array of memory cells 202A, integer X is equal to (N+1)/2.

In some embodiments, each source line SL[1], ..., SL[X] is positioned between a corresponding pair of bit lines BL[1], ..., BL[N]. In some embodiments, adjacent columns of memory cells in array of cells 202A are configured to share a single source line of the set of source lines SL. For example, source line SL1 is shared by columns 1 and 2 of array of cells 202A. Similarly, source line SL2 is shared by columns 2 and 3 of array of cells 202A. Similarly, source line SLX is shared by columns N−1 and N of array of cells 202A.

Each source line SL extends in the second direction Y. One or more source lines of the set of source lines SL in array of memory cells 202A corresponds to source line SL1 of FIG. 1.

In some embodiments, a memory cell of array of memory cells 202A is positioned between an adjacent bit line of bit lines BL and an adjacent source line of source lines SL. For example, in row 1 and column 1 of memory cell array 200, memory cell 202[1,1] is positioned between bit line BL[1] and source line SL[1]. Similarly, in row 1 and column 2 of memory cell array 200, memory cell 202[1,2] is positioned between source line SL[1] and bit line BL[2].

Each resistive switching element RE1 is coupled between a corresponding bit line of bit lines BL and a corresponding drain terminal of a corresponding selector element SE1. Each gate terminal of a corresponding selector element SE1 is coupled to a corresponding word line of word lines WL. Source terminals of a pair of adjacent selector element SE1 are coupled to a corresponding source line of source lines SL. In other words, source lines SL are shared amongst adjacent columns of memory cells in memory cell array 200.

For example, resistive switching element RE1 of memory cell 202[1,1] is coupled to bit line BL[1], the gate terminal of selector element SE1 of memory cell 202[1,1] is coupled to word line WL[1], and the source terminal of selector element SE1 of memory cell 202[1,1] is coupled to source line SL1. Similarly, resistive switching element RE1 of memory cell 202[1,2] is coupled to bit line BL[2], the gate terminal of selector element SE1 of memory cell 202[1,2] is coupled to word line WL[1], and the source terminal of selector element SE1 of memory cell 202[1,2] is coupled to source line SL1. Source line SL1 is shared by selector element SE1 of memory cell 202[1,1] and selector element SE1 of memory cell 202[1,1].

In some embodiments, memory cell array 200 includes source lines SL shared by adjacent columns of memory cells causing a decrease in the number of source lines and corresponding routing tracks than other approaches.

In some embodiments, by having less source lines and corresponding routing tracks, the width of source lines and corresponding routing tracks in memory cell array 200 is increased resulting in less source line resistance than other approaches.

In some embodiments, by having less source line resistance, a difference between the source line resistance and bit line resistance is smaller than other approaches. In some embodiments, by having a smaller difference between source line resistance and bit line resistance than other approaches results in simpler peripheral circuitry for reading and writing to memory cell array 200.

In some embodiments, by memory cell array 200 or memory circuit 300 (FIG. 3) or memory circuit 500 (FIGS. 5A-5E) having less source lines and corresponding routing tracks, memory cell array 200, memory circuit 300 or memory circuit 500 occupies less area than other memory cell arrays or memory circuits. In some embodiments, by occupying less area than other memory cell arrays, memory cell array 200, memory circuit 300 or memory circuit 500 is denser and has a larger memory capacity compared with other approaches.

Memory Circuit

Figure 3:
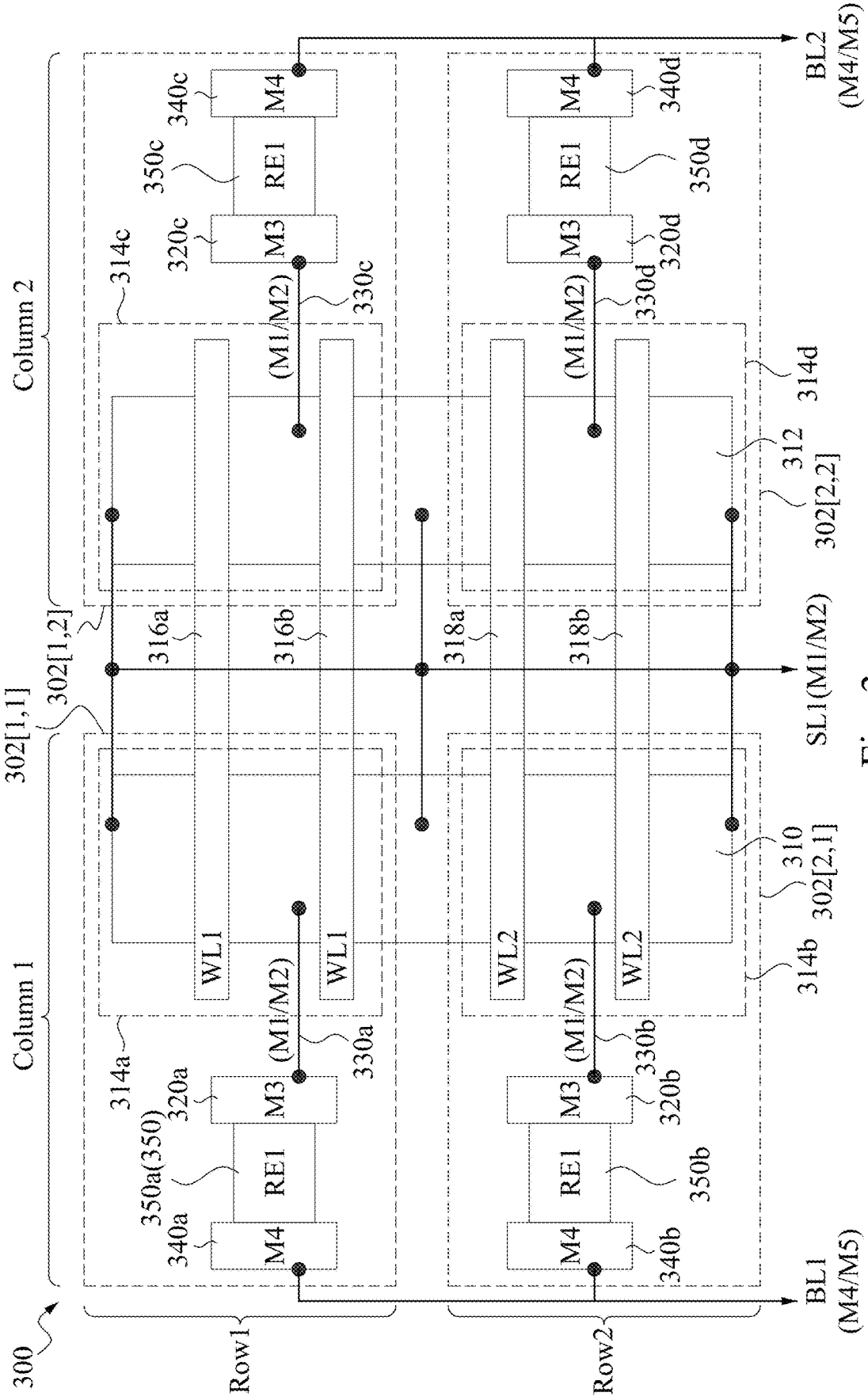
FIG. 3 is a schematic diagram of a memory circuit, in accordance with some embodiments.

FIG. 3 is a schematic diagram of a memory circuit 300, in accordance with some embodiments. Memory circuit 300 is an embodiment of the block diagram of memory cell array 200 of FIG. 2 expressed in a schematic diagram.

Memory circuit 300 relates to memory cell array 200 of FIG. 2. Memory circuit 300 includes a memory cell array 302. Memory circuit 300 is a schematic representation of two adjacent columns and two adjacent rows of a memory cell array 302. Memory cell array 302 is similar to memory cell array 200 of FIG. 2, and similar detailed description is therefore omitted.

Memory cell array 302 includes memory cells 302[1,1], 302[1,2], 302[2,1], and 302[2,2], bit lines BL1 and BL2, word lines WL1 and WL2, and a source line SL1.

Memory cells 302[1,1], 302[1,2], 302[2,1], and 302[2,2] are similar to corresponding memory cells 202[1,1], 202[1,2], 202[2,1], and 202[2,2] of FIG. 2, and similar detailed description is therefore omitted. Bit lines BL1 and BL2 are similar to corresponding bit lines BL[1] and BL[2] of FIG. 2, and similar detailed description is therefore omitted. Word lines WL1 and WL2 are similar to corresponding word lines WL[1] and WL[2] of FIG. 2, and similar detailed description is therefore omitted. Source line SL1 is similar to source line SL[1] of FIG. 2, and similar detailed description is therefore omitted.

Memory cells 302[1,1], 302[1,2], 302[2,1], and 302[2,2] include corresponding selector elements 314a, 314b, 314c and 314d coupled to corresponding resistive switching elements 350a, 350b, 350c and 350d. Selector elements 314a, 314b, 314c, and 314d are similar to selector elements SE1 of FIG. 2, and similar detailed description is therefore omitted. Resistive switching elements 350a, 350b, 350c, and 350d are similar to resistive switching elements RE1 of FIG. 2, and similar detailed description is therefore omitted.

Selector element 314a is a transistor device with an active region 310 and 2 gate portions 316a and 316b (e.g., fingers) of word line WL1. In some embodiments, active region 310 of selector element 314a or 314c or active region 312 (described below) of selector element 314b or 314d is referred to as an oxide definition (OD) region which defines the source or drain diffusion regions of memory device 300. A source of active region 310 of selector element 314a is coupled to the source line SL1. A drain of active region 310 of selector element 314a is coupled to resistive switching element 350a by a conductive structure 320a and a conductive structure 330a. Resistive switching element 350a is positioned between conductive structure 320a and conductive structure 340a. Resistive switching element 350a is coupled to bit line BL1 by the conductive structure 340a.

Selector element 314b is a transistor device with an active region 310 and 2 gate portions 318a and 318b (e.g., fingers) of word line WL2. A source of active region 310 of selector element 314b is coupled to the source line SL1. A drain of active region 310 of selector element 314b is coupled to resistive switching element 350b by a conductive structure 320b and a conductive structure 330b. Resistive switching element 350b is positioned between conductive structure 320b and conductive structure 340b. Resistive switching element 350b is coupled to bit line BL1 by the conductive structure 340b.

Selector element 314c is a transistor device with an active region 312 and 2 gate portions 316a and 316b (e.g., fingers) of word line WL1. A source of active region 312 of selector element 314c is coupled to the source line SL1. A drain of active region 312 of selector element 314c is coupled to resistive switching element 350c by a conductive structure 320c and a conductive structure 330c. Resistive switching element 350c is positioned between conductive structure 320c and conductive structure 340c. Resistive switching element 350c is coupled to bit line BL2 by the conductive structure 340b.

Selector element 314d is a transistor device with an active region 312 and 2 gate portions 318a and 318b (e.g., fingers) of word line WL2. A source of active region 312 of selector element 314d is coupled to the source line SL1. A drain of active region 312 of selector element 314d is coupled to resistive switching element 350d by a conductive structure 320d and a conductive structure 330b. Resistive switching element 350d is positioned between conductive structure 320d and conductive structure 340d. Resistive switching element 350d is coupled to bit line BL2 by the conductive structure 340d.

In some embodiments, at least word line WL1 or WL2 is in a polysilicon (POLY) layer of memory circuit 300.

The source line SL1 is coupled to the source of active region 310 of selector elements 314a and 314b and the source of active region 312 of selector elements 314c and 314d. In some embodiments, source line SL1 is in a metal one (M1) layer of memory circuit 300. In some embodiments, source line SL1 is in the M1 layer and a metal two (M2) layer of memory circuit 300. In some embodiments, at least conductive structure 330a, 330b, 330c or 330d is in the M1 layer of memory circuit 300. In some embodiments, at least conductive structure 330a, 330b, 330c or 330d is in the M1 and M2 layer of memory circuit 300.

In some embodiments, at least conductive structure 320a, 320b, 320c or 320d is in in a metal three (M3) layer of memory circuit 300.

In some embodiments, at least conductive structure 340a, 340b, 340c or 340d is in a metal four (M4) layer of memory circuit 300. In some embodiments, at least resistive switching element 350a, 350b, 350c or 350d is between the M3 and the M4 layer of memory circuit 300.

In some embodiments, at least bit line BL1 or BL2 is in the M4 layer of memory circuit 300. In some embodiments, at least bit line BL1 or BL2 is in the M4 layer and a metal five (M5) layer of memory circuit 300.

In some embodiments, the POLY layer is below the M1 layer. In some embodiments, the M1 layer is below the M2 layer. In some embodiments, the M2 layer is below the M3 layer. In some embodiments, the M3 layer is below the M4 layer. In some embodiments, the M4 layer is below the M5 layer. Other metal layers are within the scope of the present disclosure.

In some embodiments, memory circuit 300 also includes other circuits (e.g., other driver circuits, timing circuits, decoder circuits, etc.) that are not described for simplicity.

Layout Design of Memory Circuit

FIGS. 4A-4H are diagrams of a layout design 400, in accordance with some embodiments. Layout design 400 is a layout diagram of memory circuit 300 of FIG. 3 or memory cell 100 of FIG. 1. Layout design 400 is usable to manufacture memory cell 100, memory circuit 300 or 500.

Figure 4A:
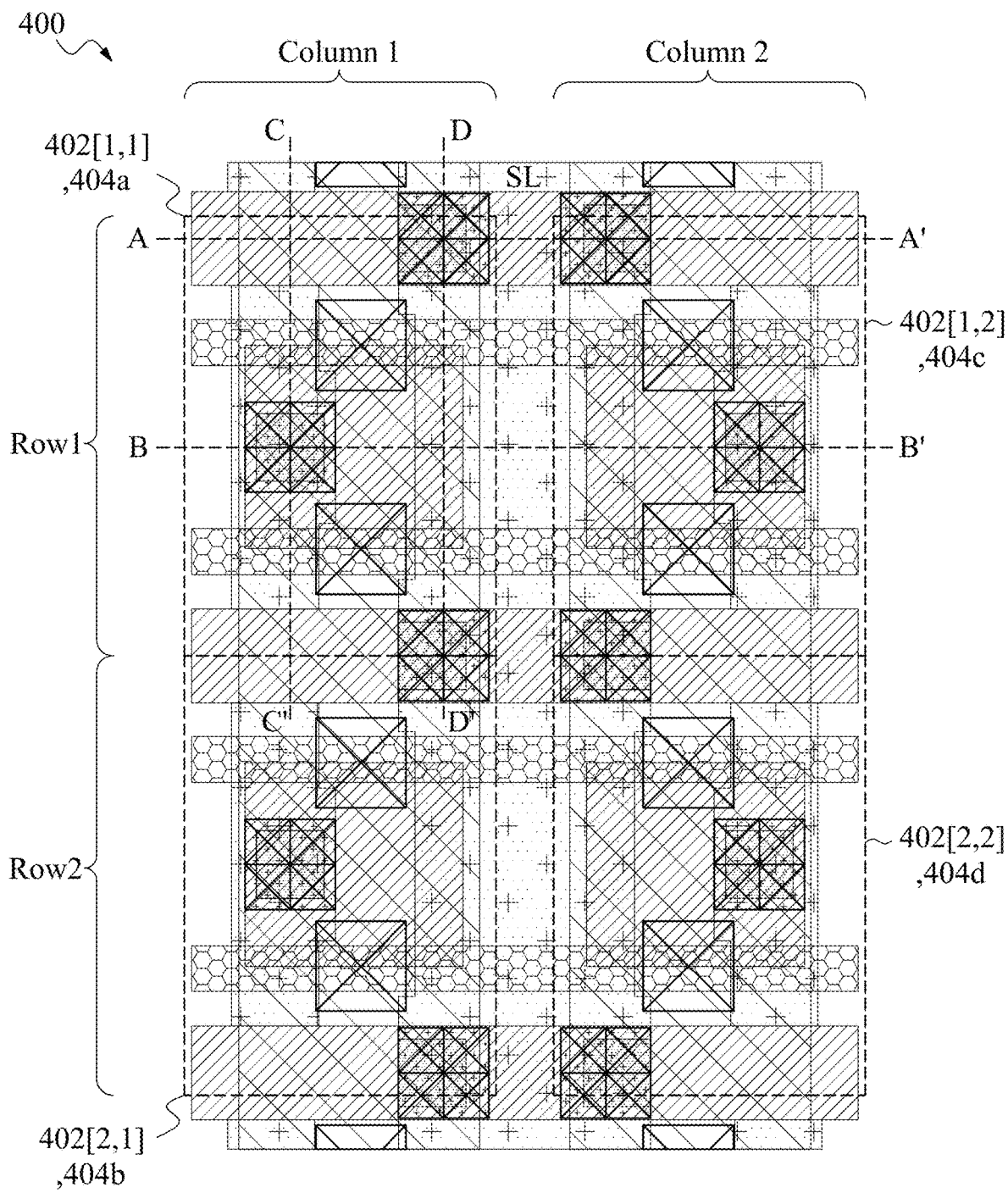
FIGS. 4A-4H are diagrams of a layout design, in accordance with some embodiments.

FIG. 4A is a diagram of layout design 400. For ease of illustration, some of the labeled elements of FIGS. 4B-4H are not labelled in FIG. 4A. In some embodiments, FIGS. 4A-4H include additional elements not shown in FIGS. 4A-4H.

FIGS. 4B-4H are diagrams of a corresponding portion 400B-400H of layout design 400 of FIG. 4A, simplified for ease of illustration. Portion 400B includes one or more features of layout design 400 of FIG. 4A from the active (OD) level to the metal one (M1) level of layout design 400. Portion 400C includes one or more features of layout design 400 of FIG. 4A from the M1 level to the M2 level of layout design 400. Portion 400D includes one or more features of layout design 400 of FIG. 4A from the M2 level to the M3 level of layout design 400. Portion 400E includes one or more features of layout design 400 of FIG. 4A from the M3 level to the TE level of layout design 400. Portion 400F includes one or more features of layout design 400 of FIG. 4A from the M3 level to the M4 level of layout design 400. Portion 400G includes one or more features of layout design 400 of FIG. 4A from the M4 level and via four (V4) level of layout design 400. Portion 400H includes one or more features of layout design 400 of FIG. 4A from the M5 level and V4 level of layout design 400.

Layout design 400 includes one or more of memory cell layout patterns 402[1,1], 402[1,2], 402[2,1] or 402[2,2]. Memory cell layout patterns 402[1,1], 402[1,2], 402[2,1] and 402[2,2] are useable to manufacture corresponding memory cells 302[1,1], 302[1,2], 302[2,1] and 302[2,2] of memory circuit 300 of FIG. 3.

In some embodiments, memory cell layout pattern 402[1,1], 402[1,2], 402[2,1], 402[2,2] include at least a corresponding selector element layout pattern 404a, 404b, 404c, 404d and a corresponding resistive switching element layout pattern 450a, 450b, 450c, 450d (described below.)

In some embodiments, selector element layout pattern 404a includes at least metal over diffusion layout patterns 420a, 422a, 422b, gate layout patterns 416a, 416b or active region layout pattern 410 (described below.)

In some embodiments, selector element layout pattern 404b includes at least metal over diffusion layout patterns 420b, 422b, 422c, gate layout patterns 418a, 418b or active region layout pattern 410 (described below.)

In some embodiments, selector element layout pattern 404c includes at least metal over diffusion layout patterns 420c, 422d, 422e, gate layout patterns 416a, 416b or active region layout pattern 412 (described below.)

In some embodiments, selector element layout pattern 404d includes at least metal over diffusion layout patterns 420d, 422e, 422f, gate layout patterns 418a, 418b or active region layout pattern 412 (described below.)

Layout design 400 includes active region layout patterns 410, 412 (collectively referred to as a "set of active region layout patterns 411") extending in the second direction Y. Active region layout patterns 410, 412 of the set of active region layout patterns 411 are separated from one another in the first direction X. Active region layout patterns 410, 412 are usable to manufacture corresponding active regions 310, 312 of FIG. 3 or corresponding active regions 510, 512 (FIGS. 4A-4E) of memory circuit 500. In some embodiments, the set of active region layout patterns 411 is located on a first layout level. Other configurations or quantities of patterns in the set of active region layout patterns 411 are within the scope of the present disclosure.

Active region layout pattern 410 is part of memory cell layout patterns 402[1,1] and 402[1,2].

Layout design 400 further includes gate layout patterns 416a, 416b, 418a, 418b (collectively referred to as a "set of gate layout patterns 416") each extending in the first direction X. Each of the layout patterns of the set of gate layout patterns 416 is separated from an adjacent layout pattern of the set of gate layout patterns 416 in the second direction Y by a first pitch.

Gate layout patterns 416a, 416b, 418a, 418b are usable to manufacture corresponding gates 316a, 316b, 318a, 318b of FIG. 3. Gate layout patterns 416a, 416b are usable to manufacture corresponding gates 516a, 516b (FIGS. A-5E) of memory circuit 500. The set of gate layout patterns 416 are positioned on a second layout level (POLY) different from the first layout level. The set of active region layout patterns 411 is below the set of gate layout patterns 416.

Gate layout pattern 416a, 416b, 416c, 416d is usable to manufacture the gate terminal of NMOS transistor N1 of corresponding selector element 314a, 314b, 314c, 314d of FIG. 3. Other configurations or quantities of patterns in the set of gate layout patterns 416 are within the scope of the present disclosure.

Layout design 400 further includes metal over diffusion layout patterns 420a, 420b, 420c, 420d (hereinafter referred to as a "set of metal over diffusion layout patterns 420") and metal over diffusion layout patterns 422a, 422b, 422c, 422d, 422e, 422f (hereinafter referred to as a "set of metal over diffusion layout patterns 422"). In some embodiments, the set of metal over diffusion layout patterns 420 or 422 extends in at least the first direction X or the second direction Y.

Each of the layout patterns of the set of metal over diffusion layout patterns 420 or 422 is separated from an adjacent layout pattern of the set of metal over diffusion layout patterns 210 in at least the first direction X or the second direction Y. The set of metal over diffusion layout patterns is located on a third layout level. In some embodiments, the third layout level of layout design 400 is a metal over diffusion (MD) level. In some embodiments, the MD level is positioned above at least the active region of layout design 400.

In some embodiments, the set of metal over diffusion layout patterns 420 or 422 includes one or more features of layout patterns located on a via over diffusion (VD) level, a metal zero (M0) level or a via zero (V0) level of layout design 400 that is not shown for brevity. For example, in some embodiments, the third layout level may also include the M0 level, the POLY level or the MD level of layout design 400. In some embodiments, the set of metal over diffusion layout patterns 420 or 422 further includes via layout patterns useable to manufacture a corresponding set of vias that are coupled to upper metal layers (e.g., conductive feature layout patterns 414a, 414b, 414c, 414d, 414e).

The set of metal over diffusion layout patterns 420 or 422 is usable to manufacture a corresponding set of contacts 520 or 522 (FIGS. 5A-5E) of memory circuit 500.

In some embodiments, metal over diffusion layout pattern 420a is usable to manufacture at least a drain terminal of NMOS transistor N1 of memory cell 202[1,1] of FIG. 2 or memory cell 302[1,1] of FIG. 3. In some embodiments, metal over diffusion layout pattern 420b is usable to manufacture at least a drain terminal of NMOS transistor N1 of memory cell 202[2,1] of FIG. 2 or memory cell 302[2,1] of FIG. 3. In some embodiments, metal over diffusion layout pattern 420c is usable to manufacture at least a drain terminal of NMOS transistor N1 of memory cell 202[1,2] of FIG. 2 or memory cell 302[1,2] of FIG. 3. In some embodiments, metal over diffusion layout pattern 420d is usable to manufacture at least a drain terminal of NMOS transistor N1 of memory cell 202[2,2] of FIG. 2 or memory cell 302[2,2] of FIG. 3.

In some embodiments, metal over diffusion layout pattern 422a or 422b is usable to manufacture at least a source terminal of NMOS transistor N1 of memory cell 202[1,1] of FIG. 2 or memory cell 302[1,1] of FIG. 3. In some embodiments, metal over diffusion layout pattern 422b or 422c is usable to manufacture at least a source terminal of NMOS transistor N1 of memory cell 202[2,1] of FIG. 2 or memory cell 302[2,1] of FIG. 3. In some embodiments, metal over diffusion layout pattern 422d or 422e is usable to manufacture at least a source terminal of NMOS transistor N1 of memory cell 202[1,2] of FIG. 2 or memory cell 302[1,2] of FIG. 3. In some embodiments, metal over diffusion layout pattern 422e or 422f is usable to manufacture at least a source terminal of NMOS transistor N1 of memory cell 202[2,2] of FIG. 2 or memory cell 302[2,2] of FIG. 3.

Metal over diffusion layout patterns 420a, 420b, 422a, 422b, 422c are above active region layout pattern 410. Metal over diffusion layout patterns 420c, 420d, 422d, 422e, 422f are above active region layout pattern 412. Other configurations or quantities of patterns in the set of metal over diffusion layout patterns 420 or 422 are within the scope of the present disclosure.

Layout design 400 further includes conductive feature layout patterns 414a, 414b, 414c, 414d, 414e (hereinafter referred to as a "set of conductive feature layout patterns 414") extending in the second direction Y. In some embodiments, the set of conductive feature layout patterns 414 extends in two directions (e.g., first direction X or second direction Y). The set of conductive feature layout patterns 414 includes one or more conductive feature layout patterns.

The set of conductive feature layout patterns 414 is located on a fourth layout level. In some embodiments, the fourth layout level of layout design 400 is metal one (M1). In some embodiments, the M1 level is positioned above at least the active region, the M0 level, the POLY level or the MD level of layout design 400.

The set of conductive feature layout patterns 414 is usable to manufacture a corresponding set of conductive structures 514 (FIGS. 5A-5E) of memory circuit 500. Conductive feature layout patterns 414a, 414b, 414c, 414d are usable to manufacture corresponding conductive structures 330a, 330b, 330c, 330d of FIG. 3. Conductive feature layout pattern 414e is usable to manufacture source line SL1 FIG. 3 or conductive structure 514e (FIGS. 5A-5E) of memory circuit 500.

Conductive feature layout patterns 414a, 414c overlap gate layout patterns 416a, 416b. Conductive feature layout patterns 414b, 414d overlap gate layout patterns 418a, 418b. Conductive feature layout pattern 414e overlaps gate layout patterns 416a, 416b, 418a, 418b and active region layout patterns 410, 412.

Conductive feature layout patterns 414a, 414c overlap corresponding metal over diffusion layout patterns 420a, 420c. Conductive feature layout patterns 414b, 414d overlap corresponding metal over diffusion layout patterns 420b, 420d. Conductive feature layout pattern 414e overlaps metal over diffusion layout patterns 422a, 422b, 422c, 422d, 422e, 422f.

Conductive feature layout patterns 414a, 414b are located above an edge of active region layout pattern 410 associated with corresponding drain regions of NMOS transistor N1 of corresponding selector element 314a, 314b of FIG. 3. Conductive feature layout patterns 414c, 414d are located above an edge of active region layout pattern 412 associated with corresponding drain regions of NMOS transistor N1 of corresponding selector element 314c, 314d of FIG. 3.

Conductive feature layout pattern 414e is located above an edge of active region layout patterns 410 and 412 associated with source regions of NMOS transistor N1 of corresponding selector element 314a, 314b, 314c, 314d of FIG. 3.

Other configurations or quantities of patterns in the set of conductive feature layout patterns 414 are within the scope of the present disclosure.

Layout design 400 further includes conductive feature layout patterns 424a, 424b, 424c, 424d, 424e (hereinafter referred to as a "set of conductive feature layout patterns 424") extending in the second direction Y. In some embodiments, the set of conductive feature layout patterns 424 extends in two directions (e.g., first direction X or second direction Y). The set of conductive feature layout patterns 424 includes one or more conductive feature layout patterns. The set of conductive feature layout patterns 424 is located on a fifth layout level. In some embodiments, the fifth layout level of layout design 400 is metal two (M2). In some embodiments, the M2 level is positioned above at least the active region, the M0 level, the POLY level, the MD level or the M1 level of layout design 400.

The set of conductive feature layout patterns 424 is usable to manufacture a corresponding set of conductive structures 524 (FIGS. 5A-5E) of memory circuit 500. In some embodiments, conductive feature layout patterns 424a, 424b, 424c, 424d are usable to manufacture corresponding conductive structures 330a, 330b, 330c, 330d of FIG. 3. Conductive feature layout pattern 424e is usable to manufacture source line SL1 FIG. 3 or conductive structure 524e (FIGS. 5A-5E) of memory circuit 500. In some embodiments, source line SL1 of FIG. 3 or memory circuit 500 of FIGS. 5A-5E includes conductive structures 514e, 524e located on two different metal levels, and is manufactured by corresponding conductive feature layout patterns 414e, 424e.

Conductive feature layout patterns 424a, 424b, 424c, 424d, 424e are above corresponding conductive feature layout patterns 414a, 414b, 414c, 414d, 414e. In some embodiments, an edge of at least conductive feature layout pattern 424a, 424b, 424c, 424d or 424e is aligned in at least the first direction X or the second direction Y with an edge of a corresponding conductive feature layout pattern 414a, 414b, 414c, 414d or 414e.

Conductive feature layout patterns 424a, 424c overlap gate layout patterns 416a, 416b. Conductive feature layout patterns 424b, 424d overlap gate layout patterns 418a, 418b. Conductive feature layout pattern 424e overlaps gate layout patterns 416a, 416b, 418a, 418b and active region layout patterns 410, 412.

Conductive feature layout patterns 424a, 424c overlap corresponding metal over diffusion layout patterns 420a, 420c. Conductive feature layout patterns 424b, 424d overlap corresponding metal over diffusion layout patterns 420b, 420d. Conductive feature layout pattern 424e overlaps metal over diffusion layout patterns 422a, 422b, 422c, 422d, 422e, 422f.

Conductive feature layout patterns 424a, 424b are located above an edge of active region layout pattern 410 associated with corresponding drain regions of NMOS transistor N1 of corresponding selector element 314a, 314b of FIG. 3. Conductive feature layout patterns 424c, 424d are located above an edge of active region layout pattern 412 associated with corresponding drain regions of NMOS transistor N1 of corresponding selector element 314c, 314d of FIG. 3. Conductive feature layout pattern 424e is located above an edge of active region layout patterns 410 and 412 associated with source regions of NMOS transistor N1 of corresponding selector element 314a, 314b, 314c, 314d of FIG. 3.

Other configurations or quantities of patterns in the set of conductive feature layout patterns 424 are within the scope of the present disclosure.

Layout design 400 further includes via layout patterns 430a, 430b, 430c, 430d (collectively referred to as a "set of via layout patterns 430") and via layout patterns 432a, 432b, 432c, 432d, 432e, 432f (collectively referred to as a "set of via layout patterns 432").

Set of via layout patterns 430 or 432 are between the set of conductive feature layout patterns 424 and the set of conductive feature layout patterns 414.

Via layout patterns 430a, 430b, 430c, 430d of the set of via layout patterns 430 are between corresponding conductive feature layout patterns 424a, 424b, 424c, 424d of the set of conductive feature patterns 424 and corresponding conductive feature layout patterns 414a, 414b, 414c, 414d of the set of conductive feature patterns 414.

Via layout patterns 432a, 432b, 432c, 432d, 432e, 432f of the set of via layout patterns 432 are between conductive feature layout pattern 424e of the set of conductive feature patterns 424 and conductive feature layout pattern 414e of the set of conductive feature patterns 414.

The set of via layout patterns 430 and 432 are positioned at a V1 level of layout design 400. In some embodiments, the V1 level is between the M1 level and the M2 level. In some embodiments, the V1 level is positioned above at least the V0 level, the VG level or the VD level of layout design 400.

The set of via layout patterns 430 is usable to manufacture a corresponding set of vias 530 (FIGS. 5A-5E). The set of vias 530 couple at least a member of the set of conductive structures 524 to at least a member of the set of conductive structures 514.

The set of via layout patterns 432 is usable to manufacture a corresponding set of vias 532 (FIGS. 5A-5E). The set of vias 532 couple at least a member of the set of conductive structures 524 to at least a member of the set of conductive structures 514.

In some embodiments, a via layout pattern 430a, 430b, 430c, 430d of the set of via layout patterns 430 is located where a corresponding conductive feature layout pattern 424a, 424b, 424c, 424d of the set of conductive feature layout patterns 424 overlaps a corresponding layout pattern 420a, 420b, 420c, 420d of the set of metal over diffusion layout patterns 420. In some embodiments, a center of via layout pattern 430a, 430b, 430c, 430d of the set of via layout patterns 430 is below a center of a corresponding conductive feature layout pattern 424a, 424b, 424c, 424d of the set of conductive feature layout patterns 424.

In some embodiments, a center of via layout pattern 430a, 430b, 430c, 430d of the set of via layout patterns 430 is aligned in at least the first direction X or the second direction Y with a center of a corresponding layout pattern 420a, 420b, 420c, 420d of the set of metal over diffusion layout patterns 420 resulting in a source line, manufactured by layout design 400, with a lower source line resistance than other approaches.

In some embodiments, a via layout pattern 432a, 432b, 432c, 432d, 432e, 432f of the set of via layout patterns 432 is located where conductive feature layout pattern 424e of the set of conductive feature layout patterns 424 overlaps a corresponding layout pattern 422a, 422b, 422c, 422d, 422e, 422f of the set of metal over diffusion layout patterns 422. In some embodiments, a center of via layout pattern 432a, 432b, 432c, 432d, 432e, 432f of the set of via layout patterns 432 is aligned in at least the first direction X or the second direction Y with a center of a corresponding layout pattern 422a, 422b, 422c, 422d, 422e, 422f of the set of metal over diffusion layout patterns 422 resulting in a source line, manufactured by layout design 400, with a lower source line resistance than other approaches.

Other configurations of set of via layout patterns 430 or 432 are within the scope of the present disclosure.

Layout design 400 further includes conductive feature layout patterns 434a, 434b, 434c, 434d (hereinafter referred to as a "set of conductive feature layout patterns 434") and conductive feature layout patterns 436a, 436b, 436c (hereinafter referred to as a "set of conductive feature layout patterns 436").

The set of conductive feature layout patterns 436 extends in the second direction Y. In some embodiments, the set of conductive feature layout patterns 434 extends in at least the first direction X or the second direction Y. In some embodiments, at least one layout pattern of the set of conductive feature layout patterns 434 has a rectangular shape.

The set of conductive feature layout patterns 434 or 436 includes one or more conductive feature layout patterns. The set of conductive feature layout patterns 434 or 436 is located on a sixth layout level. In some embodiments, the sixth layout level of layout design 400 is metal three (M3). In some embodiments, the M3 level is positioned above at least the active region, the M0 level, the POLY level, the MD level, the M1 level or the M2 level of layout design 400.

The set of conductive feature layout patterns 434 is usable to manufacture a corresponding set of conductive structures 534 (FIGS. 5A-5E) of memory circuit 500. In some embodiments, conductive feature layout patterns 434a, 434b, 434c, 434d are usable to manufacture corresponding conductive structures 320a, 320b, 320c, 320d of FIG. 3.

Conductive feature layout patterns 436a, 436b are usable to manufacture corresponding conductive structures 536a, 536b (FIGS. 5A-5E) of memory circuit 500 configured as corresponding word lines WL1, WL2.

Conductive feature layout patterns 434a, 434b, 434c, 434d are above corresponding conductive feature layout patterns 424a, 424b, 424c, 424d. The set of conductive feature layout patterns 434 or 436 overlap at least a portion of one or more of conductive feature layout patterns 424a, 424b, 424c, 424d or 424e. Conductive feature layout patterns 436b is positioned between conductive feature layout patterns 434a, 434b, 434c, 434d.

Other configurations or quantities of patterns in the set of conductive feature layout patterns 434 or 436 are within the scope of the present disclosure.

Layout design 400 further includes via layout patterns 438a, 438b, 438c, 438d (collectively referred to as a "set of via layout patterns 438") between the set of conductive feature layout patterns 424 and the set of conductive feature layout patterns 434.

Via layout patterns 438a, 438b, 438c, 438d of the set of via layout patterns 438 are between corresponding conductive feature layout patterns 424a, 424b, 424c, 424d of the set of conductive feature layout patterns 424 and corresponding conductive feature layout patterns 434a, 434b, 434c, 434d of the set of conductive feature patterns 434.

The set of via layout patterns 438 are positioned at a V2 level of layout design 400. In some embodiments, the V2 level is between the M2 level and the M3 level. In some embodiments, the V2 level is positioned above at least the V0 level, the VG level, the VD level or the V1 level of layout design 400.

The set of via layout patterns 438 is usable to manufacture a corresponding set of vias 538 (FIGS. 5A-5E). The set of vias 538 couple at least a member of the set of conductive structures 524 to at least a member of the set of conductive structures 534.

In some embodiments, a via layout pattern 438a, 438b, 438c, 438d of the set of via layout patterns 438 is located where a corresponding conductive feature layout pattern 424a, 424b, 424c, 424d of the set of conductive feature layout patterns 424 is overlapped by a corresponding layout pattern 434a, 434b, 434c, 434d of the set of conductive feature layout patterns 434.

In some embodiments, a center of via layout pattern 438a, 438b, 438c, 438d of the set of via layout patterns 438 is aligned in at least the first direction X or the second direction Y with a center of a corresponding via layout pattern 430a, 430b, 430c, 430d of the set of via layout patterns 430.

Other configurations of set of via layout patterns 438 is within the scope of the present disclosure.

Layout design 400 further includes resistive switching element layout patterns 450a, 450b, 450c, 450d (hereinafter referred to as a "set of resistive switching element layout patterns 450".)

The set of resistive switching element layout patterns 450 are usable to manufacture set of resistive switching elements 350 or set of resistive switching elements 550 (FIGS. 5A-5E) of memory circuit 500. In some embodiments, resistive switching element layout patterns 450a, 450b, 450c, 450d are usable to manufacture corresponding resistive switching elements 350a, 350b, 350c, 350d of FIG. 3. At least one of the set of resistive switching element layout patterns 450 is usable to manufacture resistive switching element 104 of FIG. 1.

The set of resistive switching element layout patterns 450 is located on a seventh layout level. In some embodiments, the seventh layout level of layout design 400 is above the M3 and below the M4 level. In some embodiments, the seventh layout level is positioned above at least the active region, the M0 level, the POLY level, the MD level, the M1 level, the M2 level or the M3 level of layout design 400.

Resistive switching element layout patterns 450a, 450b, 450c, 450d include corresponding bottom electrode layout patterns 452a, 452b, 452c, 452d (hereinafter referred to as a "set of bottom electrode layout patterns 452"), corresponding resistive switching material layout patterns 454a, 454b, 454c, 454d (hereinafter referred to as a "set of resistive switching material layout patterns 454") and corresponding top electrode layout patterns 460a, 460b, 460c, 460d (hereinafter referred to as a "set of top electrode layout patterns 460.")

The set of bottom electrode layout patterns 452 are usable to manufacture a bottom electrode 104a of FIG. 1 or a set of bottom electrodes 552 (FIGS. 5A-5E) of memory circuit 500.

The set of bottom electrode layout patterns 452 extends in at least the first direction X or the second direction Y. In some embodiments, at least one layout pattern of the set of bottom electrode layout patterns 452 has a rectangular shape. The set of bottom electrode layout patterns 452 includes one or more bottom electrode layout patterns.

Bottom electrode layout patterns 452a, 452b, 452c, 452d are above corresponding conductive feature layout patterns 434a, 434b, 434c, 434d. In some embodiments, a center of bottom electrode layout pattern 452a, 452b, 452c, 452d of the set of bottom electrode layout patterns 452 is aligned in at least the first direction X or the second direction Y with a center of a corresponding conductive feature layout pattern 434a, 434b, 434c, 434d of the set of conductive feature layout patterns 434.

The set of resistive switching material layout patterns 454 are usable to manufacture a resistive switching material 104a of FIG. 1 or a resistive switching material 554 (FIGS. 5A-5E) of memory circuit 500.

The set of resistive switching material layout patterns 454 extends in the second direction Y. In some embodiments, at least one layout pattern of the set of resistive switching material layout patterns 454 has a rectangular shape. The set of resistive switching material layout patterns 454 includes one or more resistive switching material layout patterns.

Resistive switching material layout patterns 454a, 454b, 454c, 454d overlap at least a portion of corresponding conductive feature layout patterns 434a, 434b, 434c, 434d. Resistive switching material layout patterns 454a, 454b, 454c, 454d overlap corresponding bottom electrode layout patterns 452a, 452b, 452c, 452d. Resistive switching material layout patterns 454a, 454b, 454c, 454d are above corresponding bottom electrode layout patterns 452a, 452b, 452c, 452d.

The set of top electrode layout patterns 460 are usable to manufacture a top electrode 104c of FIG. 1 or a set of top electrodes 560 (FIGS. 5A-5E) of memory circuit 500.

The set of top electrode layout patterns 460 extends in at least the first direction X or the second direction Y. In some embodiments, at least one layout pattern of the set of top electrode layout patterns 460 has a rectangular shape. The set of top electrode layout patterns 460 includes one or more top electrode layout patterns.

Top electrode layout patterns 460a, 460b, 460c, 460d are above corresponding resistive switching material layout patterns 454a, 454b, 454c, 454d. In some embodiments, a center of top electrode layout pattern 460a, 460b, 460c, 460d of the set of top electrode layout patterns 460 is offset in at least the second direction Y with a center of a corresponding bottom electrode layout pattern 452a, 452b, 452c, 452d of the set of bottom electrode layout patterns 452.

Other configurations or quantities of patterns in the set of resistive switching element layout patterns 450, set of bottom electrode layout patterns 452, set of resistive switching material layout patterns 454, set of top electrode layout patterns 460 are within the scope of the present disclosure.

Layout design 400 further includes conductive feature layout patterns 440a, 440b (hereinafter referred to as a "set of conductive feature layout patterns 440") extending in the second direction Y. The set of conductive feature layout patterns 440 includes one or more conductive feature layout patterns. The set of conductive feature layout patterns 440 is located on an eighth layout level. In some embodiments, the eighth layout level of layout design 400 is metal four (M4). In some embodiments, the M4 level is positioned above at least the active region, the M0 level, the POLY level, the MD level, the M1 level, the M2 level or the M3 level of layout design 400.

The set of conductive feature layout patterns 440 is usable to manufacture set of conductive structures 540 (FIGS. 5A-5E) of memory circuit 500. In some embodiments, conductive feature layout patterns 440a, 440b are usable to manufacture corresponding conductive structures 540a, 540b (FIGS. 5A-5E) of memory circuit 500. In some embodiments, conductive feature layout pattern 440a is usable to manufacture conductive structures 340a, 340b of FIG. 3. In some embodiments, conductive feature layout pattern 440b is usable to manufacture conductive structures 340c, 340d of FIG. 3. In some embodiments, conductive feature layout patterns 440a, 440b are usable to manufacture corresponding bit lines BL1, BL2 of FIG. 3.

Conductive feature layout patterns 440a, 440b are above resistive switching element layout patterns 450a, 450b, 450c, 450d. Conductive feature layout pattern 440a overlaps resistive switching element layout patterns 450a, 450b. Conductive feature layout pattern 440b overlaps resistive switching element layout patterns 450c, 450d. In some embodiments, a center of conductive feature layout patterns 440a, 440b is aligned in at least the first direction X with a center of corresponding resistive switching element layout patterns 450a, 450b.

Other configurations or quantities of patterns in the set of conductive feature layout patterns 440 are within the scope of the present disclosure.

Layout design 400 further includes conductive feature layout patterns 470a, 470b (hereinafter referred to as a "set of conductive feature layout patterns 470") extending in the second direction Y. The set of conductive feature layout patterns 470 includes one or more conductive feature layout patterns. The set of conductive feature layout patterns 470 is located on a ninth layout level. In some embodiments, the ninth layout level of layout design 400 is metal five (M5). In some embodiments, the M5 level is positioned above at least the active region, the M0 level, the POLY level, the MD level, the M1 level, the M2 level, the M3 or the M4 level of layout design 400.

The set of conductive feature layout patterns 470 is usable to manufacture set of conductive structures 570 (FIGS. 5A-5E) of memory circuit 500. In some embodiments, conductive feature layout patterns 470a, 470b are usable to manufacture corresponding conductive structures 570a, 570b (FIGS. 5A-5E) of memory circuit 500. In some embodiments, conductive feature layout patterns 470a, 470b are usable to manufacture corresponding bit lines BL1, BL2 of FIG. 3 or corresponding conductive structures 570a, 570b (FIGS. 5A-5E) of memory circuit 500. In some embodiments, bit line BL1 of FIG. 3 or memory circuit 500 of FIGS. 5A-5E includes conductive structures 540a, 570a located on two different metal levels, and is manufactured by corresponding conductive feature layout patterns 440a, 470a. In some embodiments, bit line BL2 of FIG. 3 or memory circuit 500 of FIGS. 5A-5E includes conductive structures 540b, 570b located on two different metal levels, and is manufactured by corresponding conductive feature layout patterns 440b, 470b.

Conductive feature layout patterns 470a, 470b are above conductive feature layout patterns 440a, 440b. In some embodiments, an edge of at least conductive feature layout pattern 470a, 470b is aligned in at least the first direction X or the second direction Y with an edge of a corresponding conductive feature layout pattern 440a, 440b. In some embodiments, a center of conductive feature layout patterns 470a, 470b is aligned in at least the first direction X or the second direction Y with a center of corresponding conductive feature layout pattern 440a, 440b.

Other configurations or quantities of patterns in the set of conductive feature layout patterns 470 are within the scope of the present disclosure.

Layout design 400 further includes via layout patterns 472a, 472b, 472c, 472d, 472e, 472f, 472g, 472h (collectively referred to as a "set of via layout patterns 472") between the set of conductive feature layout patterns 470 and the set of conductive feature layout patterns 440.

Via layout patterns 472a, 472b, 472c, 472d of the set of via layout patterns 472 are between conductive feature layout pattern 470a of the set of conductive feature patterns 470 and conductive feature layout pattern 440a of the set of conductive feature patterns 440.

Via layout patterns 472e, 472f, 472g, 472h of the set of via layout patterns 472 are between conductive feature layout pattern 470b of the set of conductive feature patterns 470 and conductive feature layout pattern 440b of the set of conductive feature patterns 440.

The set of via layout patterns 472 are positioned at a V4 level of layout design 400. In some embodiments, the V4 level is between the M4 level and the M5 level. In some embodiments, the V4 level is positioned above at least the V0 level, the VG level, the VD level, the V1 level or the V2 level of layout design 400.

The set of via layout patterns 472 is usable to manufacture a corresponding set of vias 572 (FIGS. 5A-5E). The set of vias 572 couple at least a member of the set of conductive structures 570 to at least a member of the set of conductive structures 540.

In some embodiments, a center of at least one via layout pattern 472a, 472b, 472c or 472d of the set of via layout patterns 472 is aligned in at least the first direction X with a center of a layout pattern 450a or 450b of the set of resistive switching element layout patterns 450. In some embodiments, a center of at least one via layout pattern 472e, 472f, 472g or 472h of the set of via layout patterns 472 is aligned in at least the first direction X with a center of a layout pattern 450c or 450d of the set of resistive switching element layout patterns 450.

Other configurations of set of via layout patterns 472 is within the scope of the present disclosure.

Figure 4B:
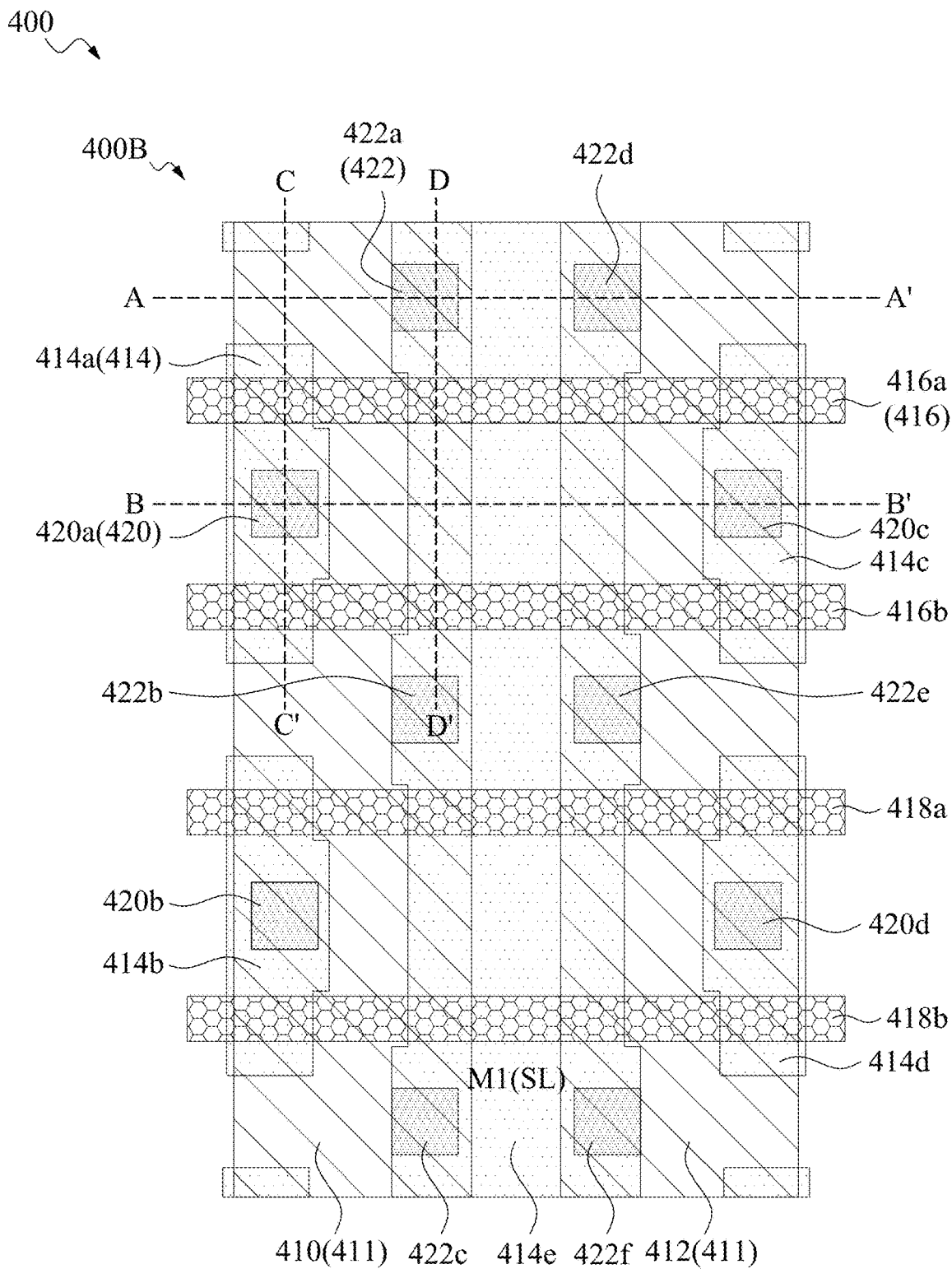
Figure 4C:
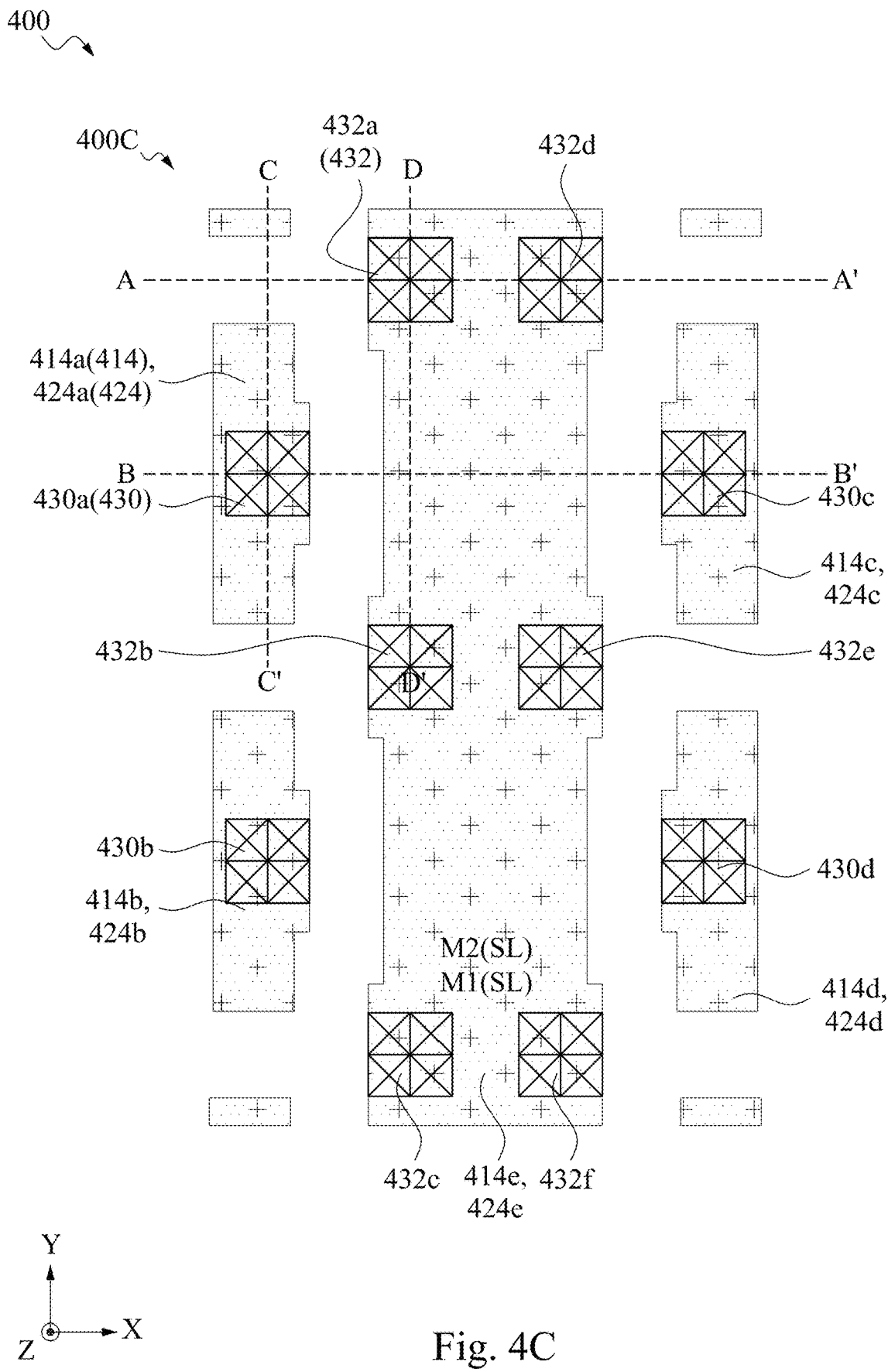
Figure 4D:
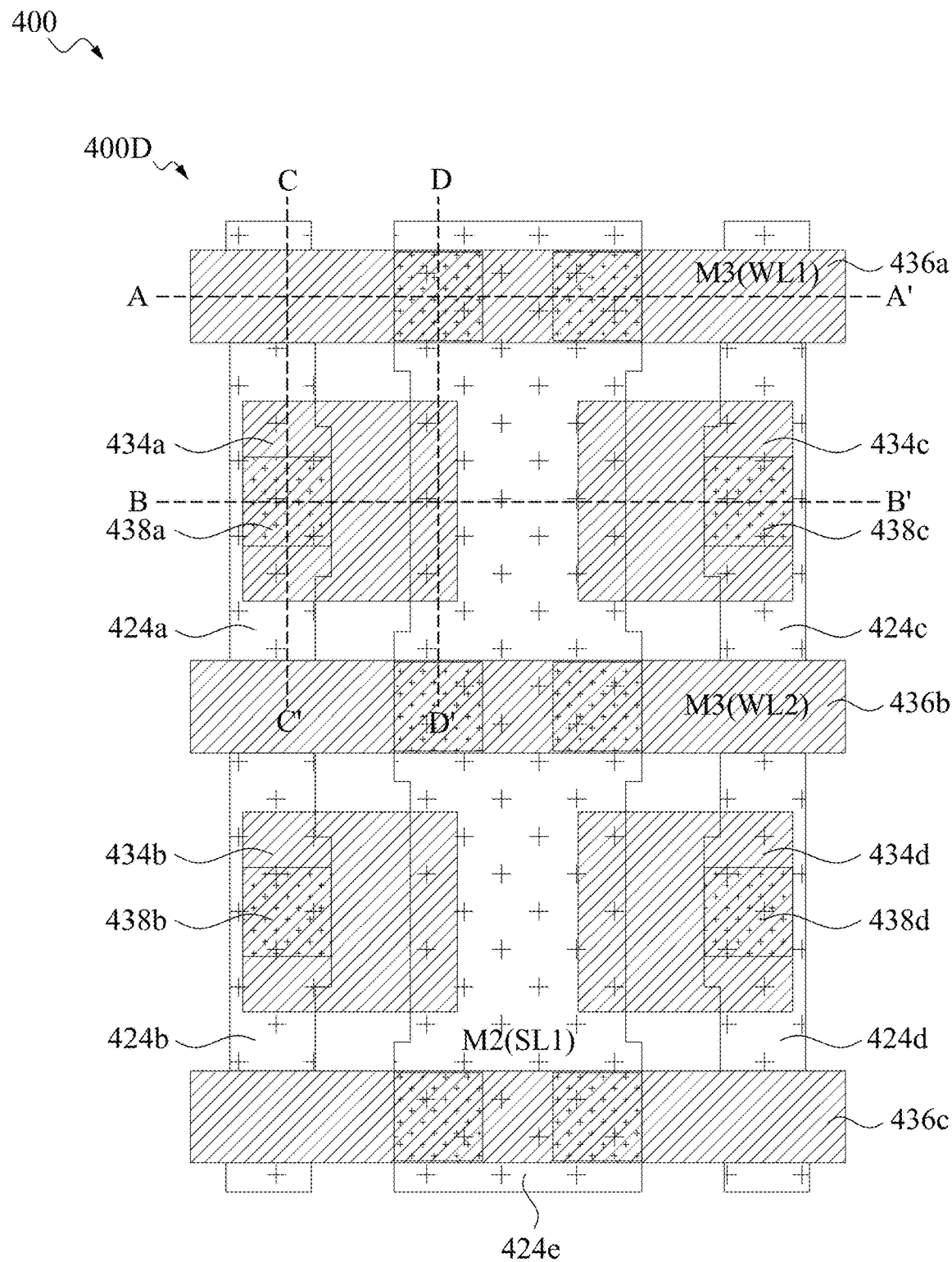
Figure 4E:
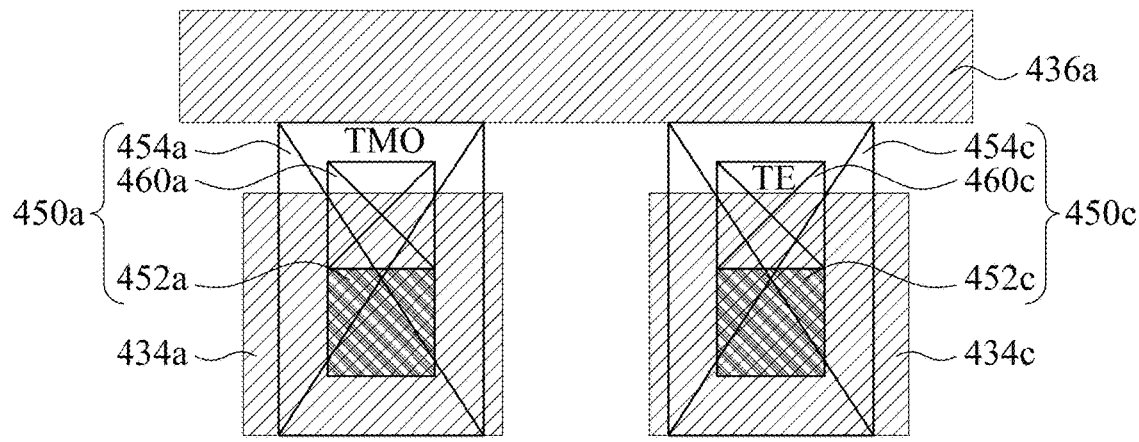
Figure 4F:
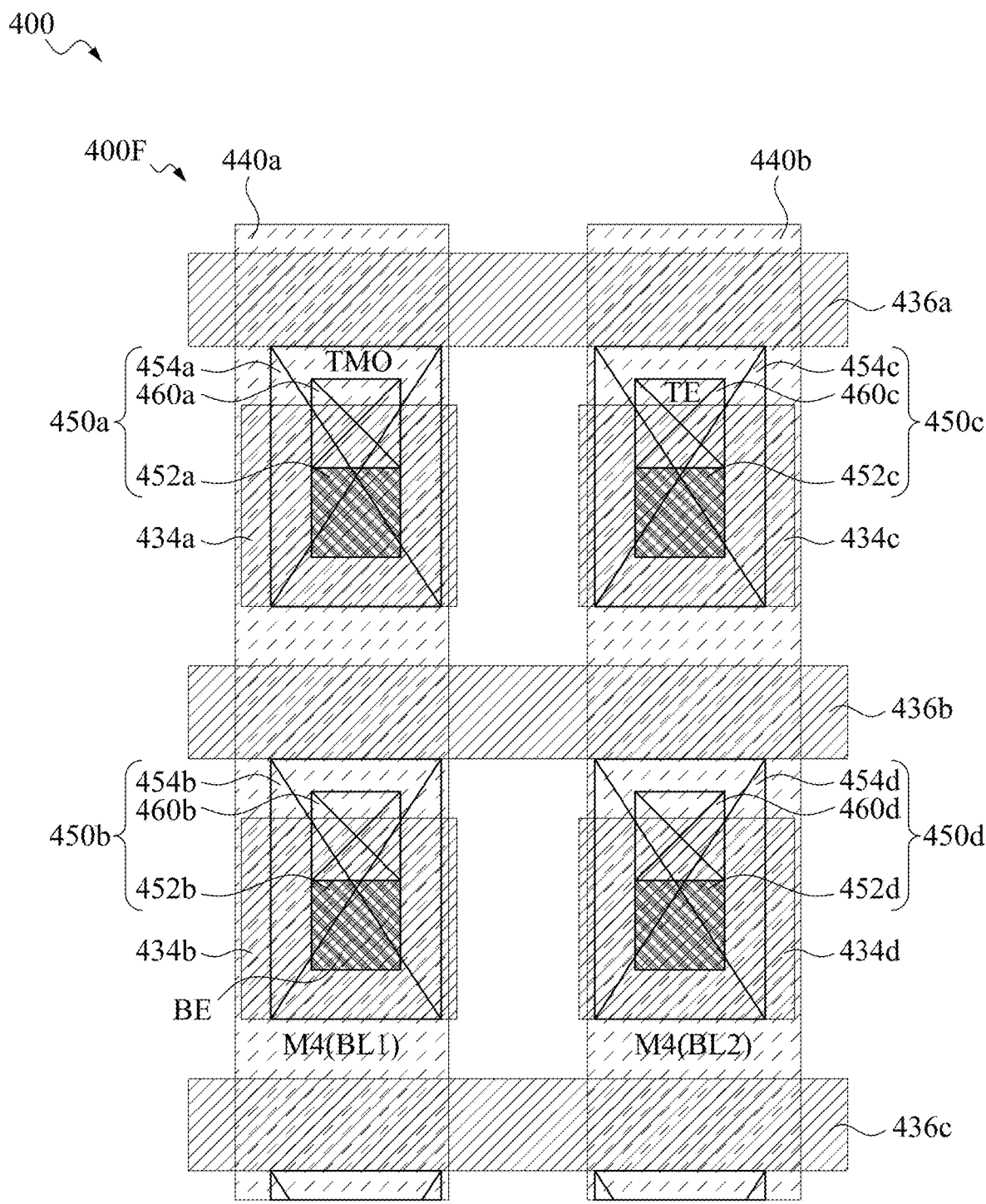
Figure 4G:
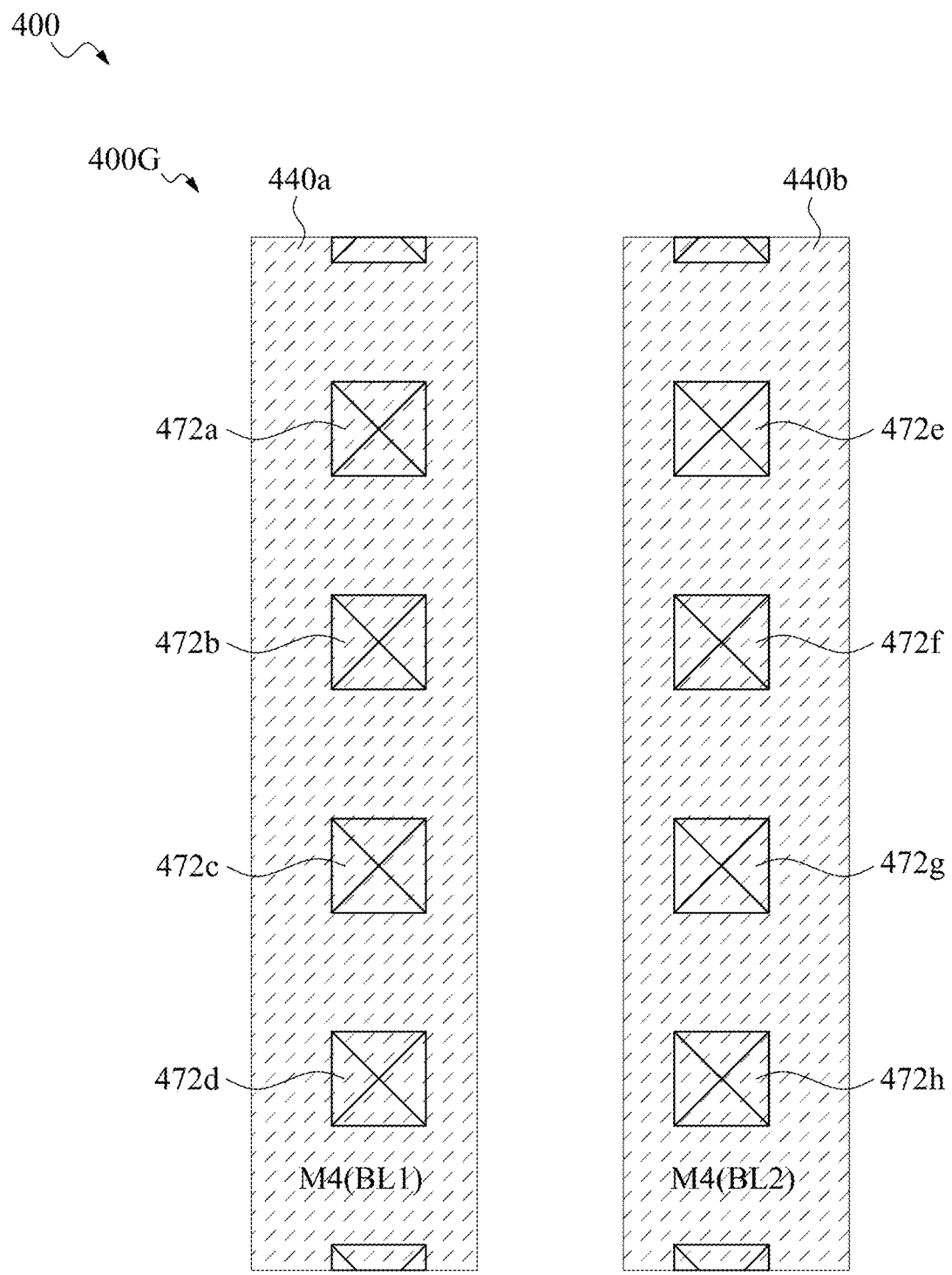
Figure 4H:
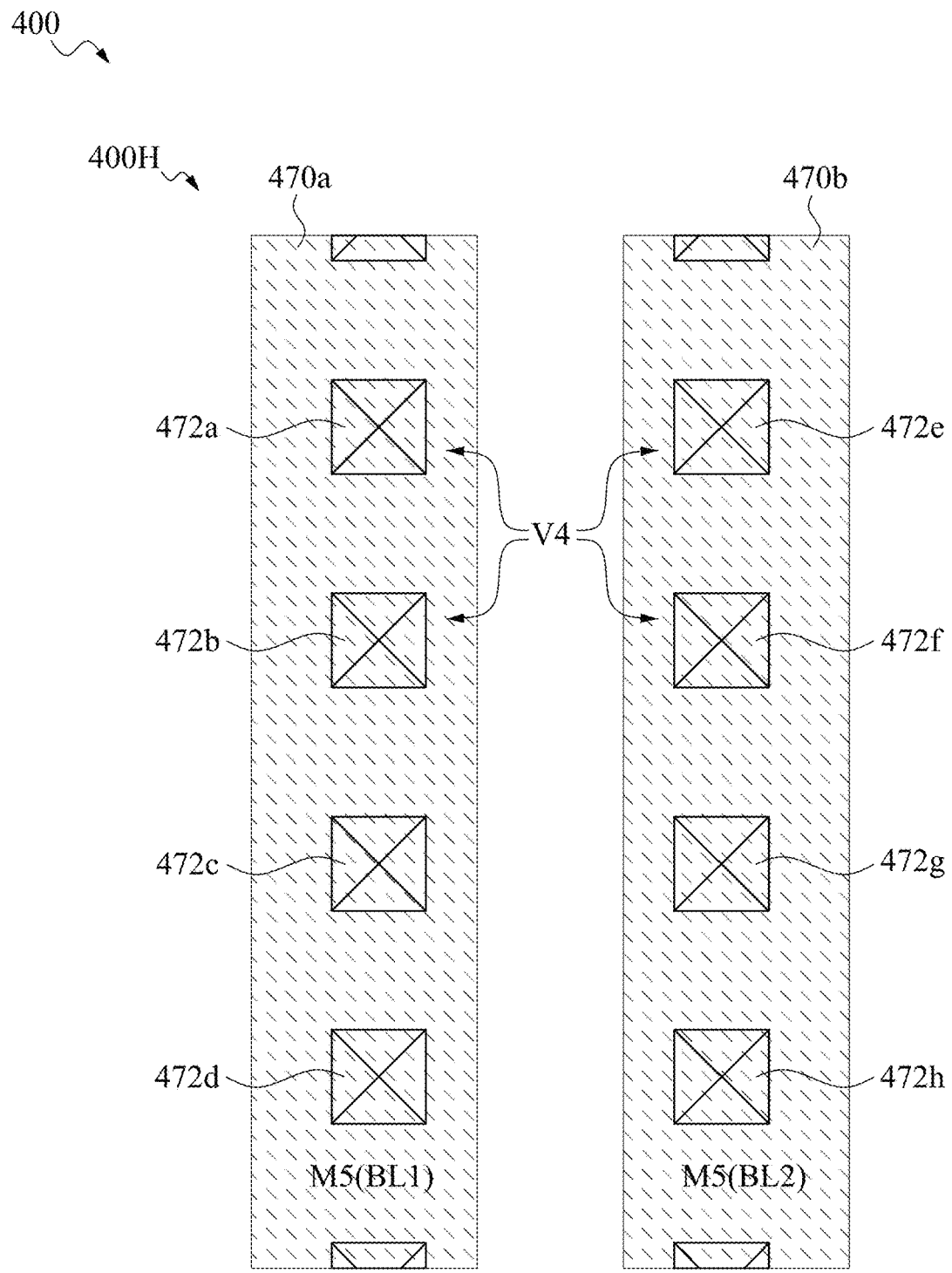
Figure 5A:
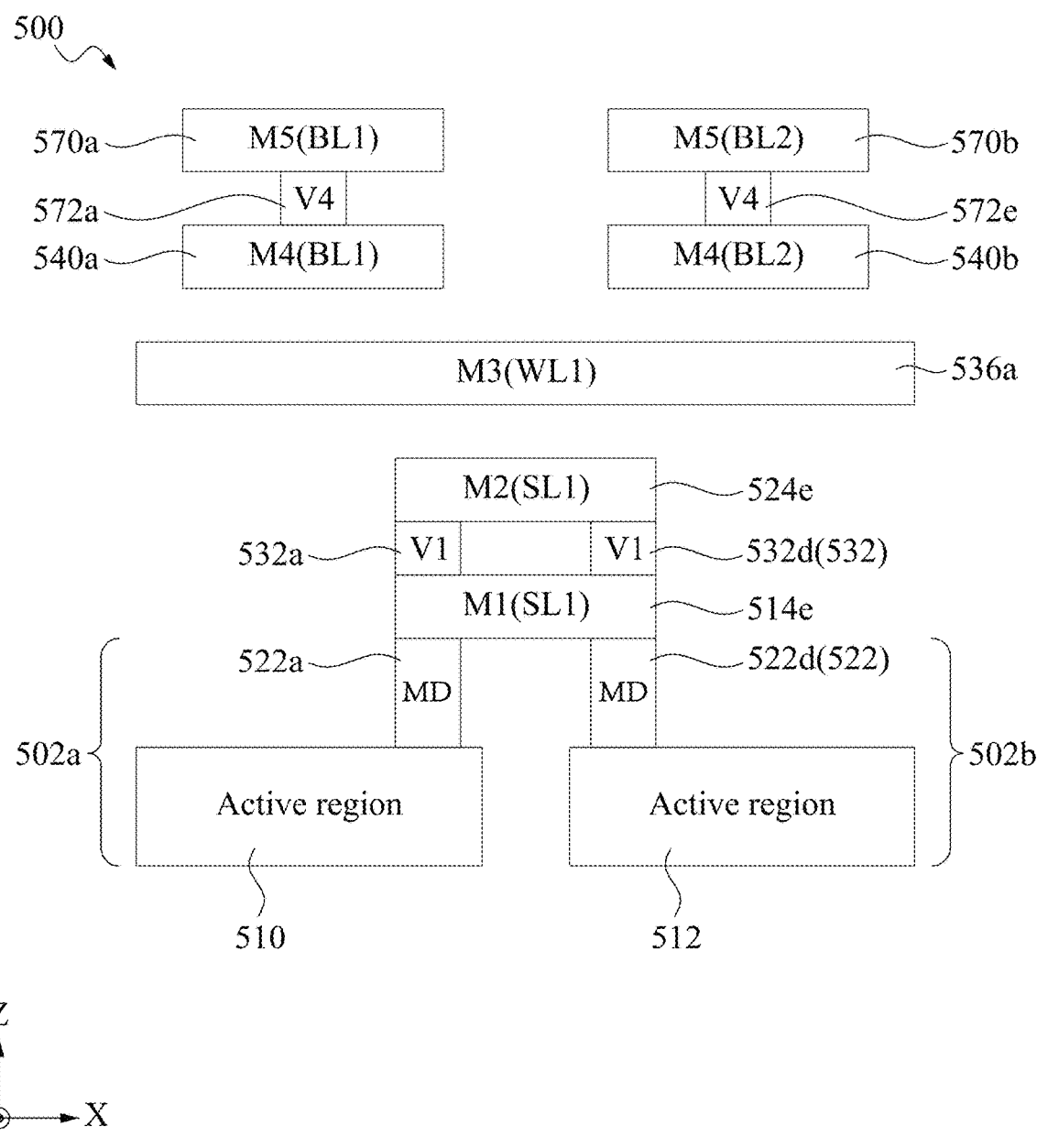
FIGS. 5A, 5B, 5C, 5D and 5E are cross-sectional views of a memory circuit, in accordance with some embodiments.
Figure 5B:
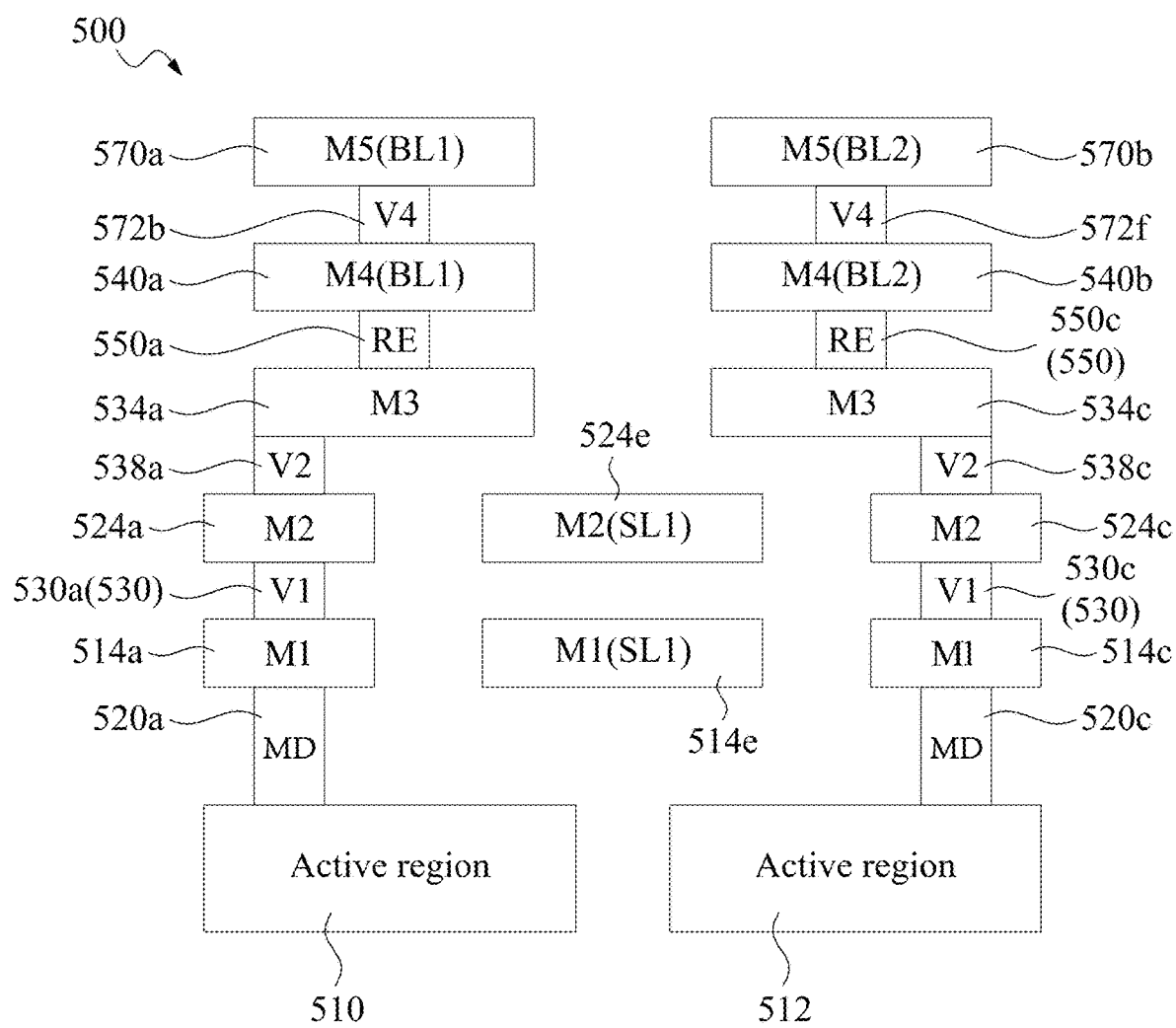
Figure 5C:
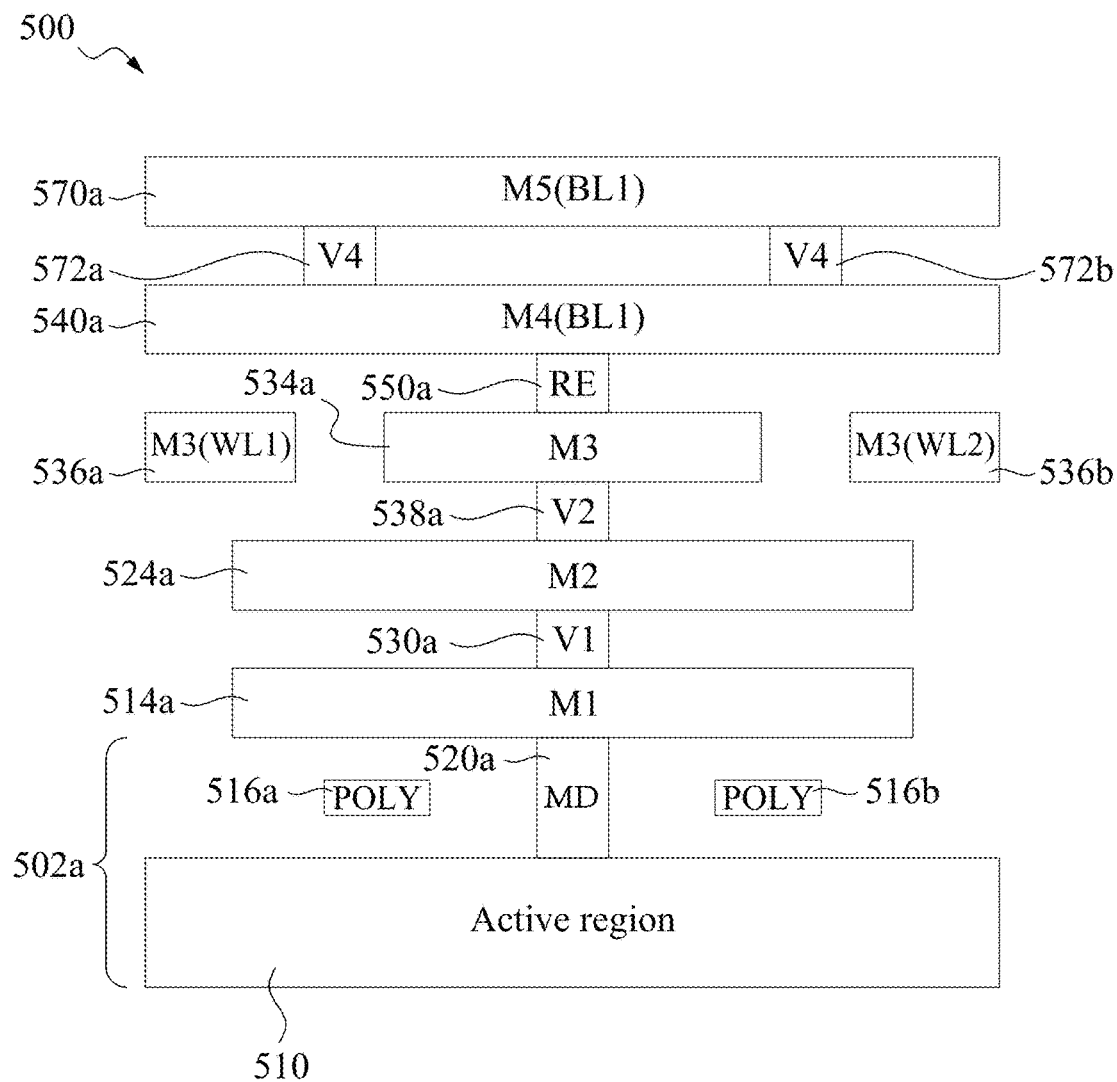
Figure 5D:
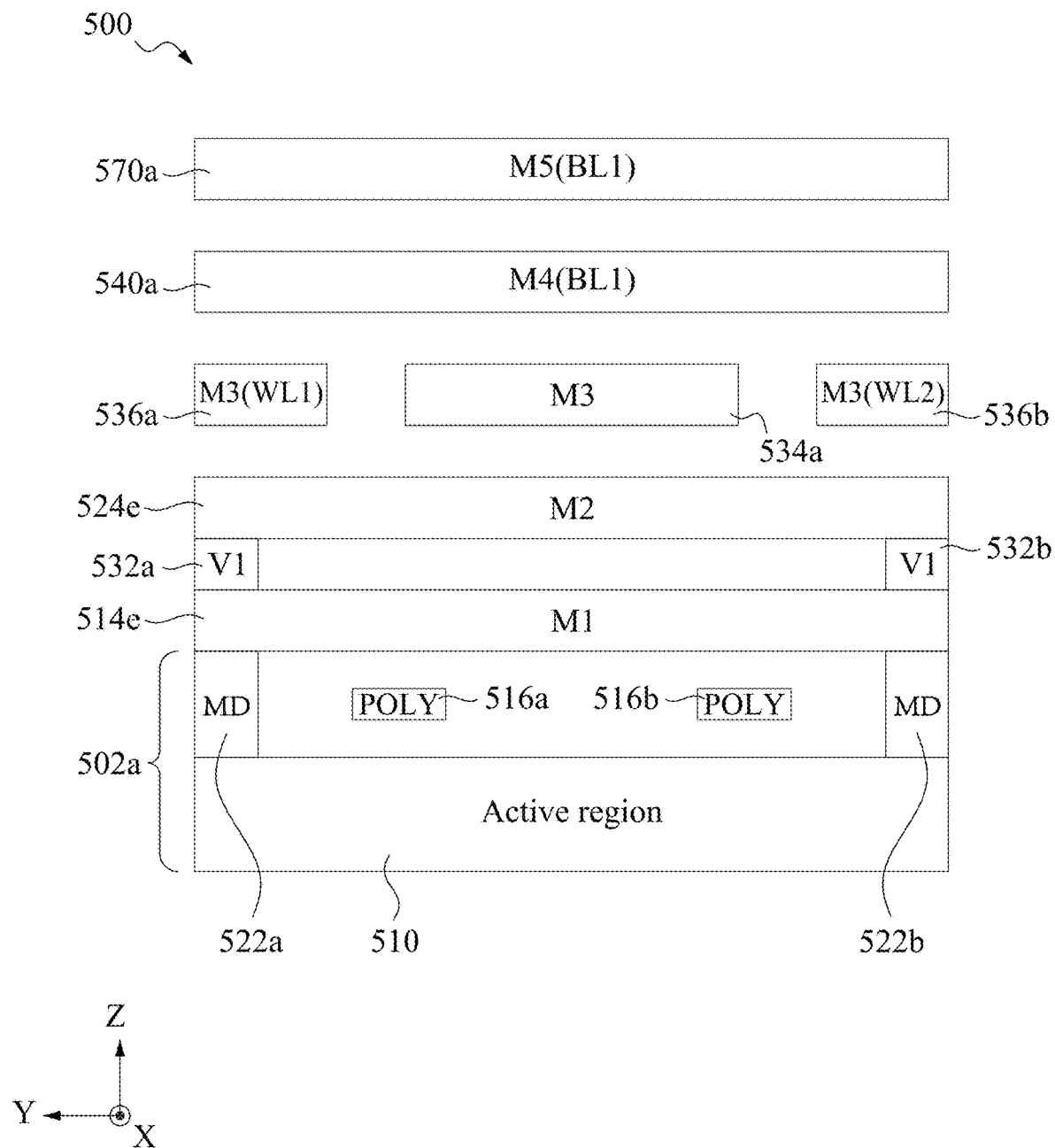
Figure 5E:
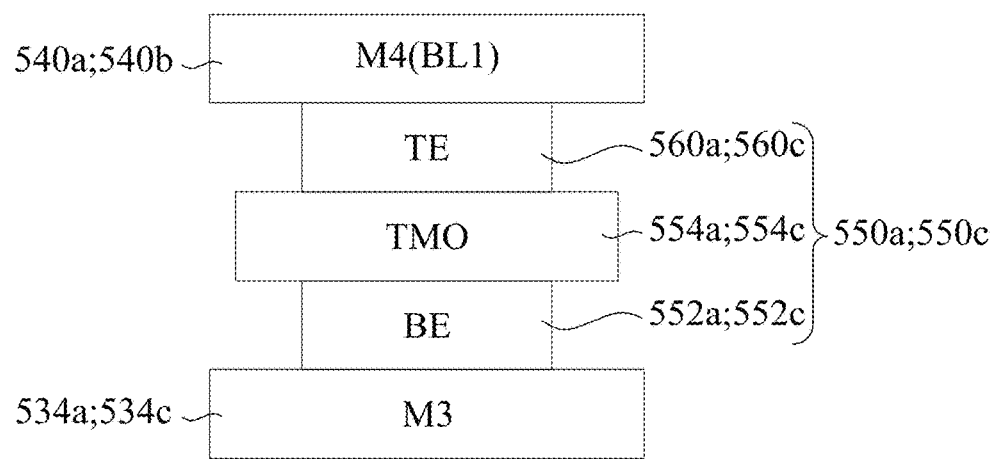
Figure 5E:
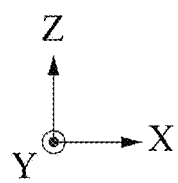

FIGS. 5A, 5B, 5C, 5D and 5E are cross-sectional views of a memory circuit 500, in accordance with some embodiments. FIG. 5A is a cross-sectional view of a memory circuit 500 corresponding to layout design 400 as intersected by plane A-A', FIG. 4B is a cross-sectional view of a memory circuit 500 corresponding to layout design 400 as intersected by plane B-B', FIG. 4C is a cross-sectional view of a memory circuit 500 corresponding to layout design 400 as intersected by plane C-C', and FIG. 4D is a cross-sectional view of a memory circuit 500 corresponding to layout design 400 as intersected by plane D-D', in accordance with some embodiments. FIG. 4E is a cross-sectional view of a zoomed in portion of resistive switching element 550a or 550c of memory circuit 500, in accordance with some embodiments. Memory circuit 400 is manufactured by layout design 400.

Components that are the same or similar to those in one or more of FIGS. 1-3 and 5A-5E (shown below) are given the same reference numbers, and detailed description thereof is thus omitted.

Memory circuit 500 is manufactured by layout design 400. Structural relationships including alignment, lengths and widths, as well as configurations of memory circuit 500 of FIGS. 5A-5E are similar to the structural relationships and configurations of memory circuit 300 of FIG. 3 or layout design 400 of FIGS. 4A-4H, and will not be described in each of FIGS. 3, 4A-4H and 5A-5E for brevity.

Memory circuit 500 relates to memory circuit 300 of FIG. 3, and similar detailed description is therefore omitted. For example, memory circuit 500 is an implementation of portions of memory cells 302[1,1] and 302[1,2]. In some embodiments, memory circuit 500 is portions of columns 1 and 2 of memory cells 302[1,1] and 302[1,2].

Memory circuit 500 includes memory cells 502a and 502b which are similar to memory cells 302[1,1] and 302[1,2] of FIG. 3, and similar detailed description is therefore omitted. In some embodiments, memory cell 502a includes at least active region 510, contact 520a, gate 516a, gate 516b, contact 522a or contact 522b (described below.) In some embodiments, memory cell 502b includes at least active region 512, contact 520c, gate 516a, gate 516b or contact 522e (described below.) In some embodiments, memory circuit 500 further includes additional memory cells or features consistent with the descriptions of FIG. 3 or FIGS. 4A-4H.

Memory circuit 500 includes one or more active regions 510, 512 (collectively referred to as "set of active regions 511") in a substrate (not shown). The set of active regions 511 extends in the second direction Y and is located on a first level of memory circuit 500. Each active region of the set of active regions 511 is separated from each other in the first direction X. In some embodiments, set of active regions 511 of memory circuit 500 is referred to as an oxide definition (OD) region which defines the source or drain diffusion regions of memory circuit 500. In some embodiments, the first level of memory circuit 500 is referred to as the Active/Fin level. In some embodiments, active region 510, 512 includes a set of fins (not shown) extending in the first direction and being below a set of gates 516. In some embodiments, each of the fins (not shown) is separated from an adjacent fin of the set of fins (not shown) by a fin pitch (not shown). Other quantities or configurations of the set of active region 511 are within the scope of the present disclosure.

Memory circuit 500 further includes one or more gates 516a, 516b (collectively referred to as "set of gates 516") extending in the first direction X, overlapping at least the set of active regions 511 and being located on a second level of memory circuit 500. In some embodiments, the second level of memory circuit 500 is different from the first level. In some embodiments, the second level is the POLY level. Each of the gates of the set of gates 516 is separated from an adjacent gate of the set of gates 404 in the second direction Y by a poly pitch. In some embodiments, the second level of memory circuit 500 is referred to as the Poly level.

Gates 516a, 516b correspond to the gate terminal of NMOS transistor N1 of selector element 314a or 314c of FIG. 3. Other quantities or configurations of the set of gates 516 are within the scope of the present disclosure.

Memory circuit 500 further includes one or more contacts 520a, 520c (collectively referred to as a "set of contacts 520") and contacts 522a, 522b, 522d (collectively referred to as a "set of contacts 522") extending in at least the first direction X or the second direction Y, overlapping the set of active regions 511, and being located on a third level of memory circuit 500. In some embodiments, the third level of memory circuit 500 is the MD level. In some embodiments, the MD level is positioned above at least the active region of layout design 400. In some embodiments, the set of contacts 520 or 522 further includes vias that are configured to be coupled to upper metal layers (e.g., M1, M2, etc.)

Each of the contacts 520a, 520c of the set of contacts 520 is separated from an adjacent contact of the set of contacts 520 in at least the first direction X or the second direction. Each of the contacts 522a, 522b, 522d of the set of contacts 522 is separated from an adjacent contact of the set of contacts 522 in at least the first direction X or the second direction.

In some embodiments, contact 520a is a drain terminal of NMOS transistor N1 of memory cell 202[1,1] of FIG. 2 or memory cell 302[1,1] of FIG. 3. In some embodiments, contact 520c is a drain terminal of NMOS transistor N1 of memory cell 202[1,2] of FIG. 2 or memory cell 302[1,2] of FIG. 3.

In some embodiments, contact 522a or 522b is at least a source terminal of NMOS transistor N1 of memory cell 202[1,1] of FIG. 2 or memory cell 302[1,1] of FIG. 3. In some embodiments, contact 522d is at least a source terminal of NMOS transistor N1 of memory cell 202[1,2] of FIG. 2 or memory cell 302[1,2] of FIG. 3.

Other quantities or configurations of the set of contacts 520 or 522 are within the scope of the present disclosure.

Memory circuit 500 further includes one or more conductive structures 514a, 514c, 514e (collectively referred to as a "set of conductive structures 514") extending in at least the first direction X or the second direction Y. The set of conductive structures 514 is located on a fourth level. In some embodiments, the fourth level of memory circuit 500 is metal one (M1). In some embodiments, the M1 level is positioned above at least the active region, the M0 level, the POLY level or the MD level of memory circuit 500.

Conductive structures 514a, 514c are corresponding conductive structures 330a, 330c of FIG. 3. Conductive structure 514e is source line SL1 of FIG. 3 or source line SL1 of FIG. 1.

In some embodiments, conductive structure 514a is electrically coupled to at least a drain terminal of NMOS transistor N1 of memory circuit 500, memory cell 202[1,1] of FIG. 2 or memory cell 302[1,1] of FIG. 3 by contact 520a.

In some embodiments, conductive structure 514c is electrically coupled to at least a drain terminal of NMOS transistor N1 of memory circuit 500, memory cell 202[1,2] of FIG. 2 or memory cell 302[1,2] of FIG. 3 by at least contact 520c.

In some embodiments, conductive structure 514e is electrically coupled to at least a source terminal of NMOS transistor N1 of memory circuit 500, memory cell 202[1,1] of FIG. 2 or memory cell 302[1,1] of FIG. 3 by at least contact 522a.

In some embodiments, conductive structure 514e is electrically coupled to at least a source terminal of NMOS transistor N1 of memory circuit 500, memory cell 202[1,2] of FIG. 2 or memory cell 302[1,2] of FIG. 3 by at least contact 522d.

Other quantities or configurations of the set of conductive structures 514 are within the scope of the present disclosure.

Memory circuit 500 further includes one or more vias 530a, 530c (collectively referred to as a "set of vias 530") and vias 532a, 532b, 532d (collectively referred to as a "set of vias 532"). In some embodiments, set of vias 530 or 532 electrically couple the set of conductive structures 514 to upper metal layers (e.g., M2). In some embodiments, set of vias 530 or 532 is in the V1 level of memory circuit 500. The V1 level of memory circuit 500 is between the fourth level and a fifth level of memory circuit 500. Other quantities or configurations of the set of vias 530 or 532 are within the scope of the present disclosure.

Memory circuit 500 further includes one or more conductive structures 524a, 524c, 524e (collectively referred to as a "set of conductive structures 524") extending in at least the first direction X or the second direction Y. The set of conductive structures 514 is located on a fifth level. In some embodiments, the fifth level of memory circuit 500 is metal two (M2). In some embodiments, the M2 level is positioned above at least the active region, the M0 level, the POLY level, the MD level or the M1 level of memory circuit 500.

In some embodiments, conductive structures 524a, 524c are corresponding conductive structures 330a, 330c of FIG. 3. In some embodiments, conductive structure 514e is source line SL1 of FIG. 3 or source line SL1 of FIG. 1.

In some embodiments, conductive structure 524a is electrically coupled to at least conductive structure 514a by via 530a.

In some embodiments, conductive structure 524c is electrically coupled to at least conductive structure 514c by via 530c.

In some embodiments, conductive structure 524e is electrically coupled to at least conductive structure 514e by at least via 532a or via 532d. In some embodiments, conductive structures 514e, 524e located on two different metal levels corresponds to source line SL1 of memory circuit 300 or 500 or memory cell 100 of FIG. 1 resulting in less resistance than other approaches.

In some embodiments, memory circuit 500 includes a source line SL1 (e.g., either conductive structure 514e or conductive structure 524e) positioned on a single metal level.

Other quantities or configurations of the set of conductive structures 524 are within the scope of the present disclosure.

Memory circuit 500 further includes one or more vias 538a, 538c (collectively referred to as a "set of vias 538"). In some embodiments, set of vias 538 electrically couple the set of conductive structures 524 to upper metal layers (e.g., M3). In some embodiments, set of vias 538 is in the V2 level of memory circuit 500. The V2 level of memory circuit 500 is between the fifth level and a sixth level of memory circuit 500. Other quantities or configurations of the set of vias 538 are within the scope of the present disclosure.

Memory circuit 500 further includes one or more conductive structures 534a, 534c (collectively referred to as a "set of conductive structures 534") and one or more conductive structures 536a, 536b (collectively referred to as a "set of conductive structures 536") extending in at least the first direction X or the second direction Y.

The set of conductive structures 534 or 536 is located on a sixth level. In some embodiments, the sixth level of memory circuit 500 is metal three (M3). In some embodiments, the M3 level is positioned above at least the active region, the M0 level, the POLY level, the MD level, the M1 level or the M2 level of memory circuit 500.

The set of conductive structures 534 is set of conductive structures 330 of memory circuit 300. In some embodiments, conductive structures 534a, 534c are corresponding conductive structures 320a, 320c of FIG. 3.

Conductive structure 536a is corresponding word line WL1 of memory cells 202[1,1] and 202[1,2] of FIG. 2 or memory cells 302[1,1] and 302[1,2] of FIG. 3. Conductive structure 536b is corresponding word line WL2 of memory cells 202[2,1] and 202[2,2] of FIG. 2 or memory cells 302[2,1] and 302[2,2] of FIG. 3. In some embodiments, at least word line WL1 or word line WL2 is coupled to the corresponding gate 516a, 516b in a column (not shown) of memory circuit 500 that includes strap cells. In some embodiments, strap cells are memory cells configured to provide voltage pick-up and to provide N-well or P-well bias of the active region that prevents voltage drop along word lines WL that result in a difference in memory cell device voltages along the word lines WL as the word lines WL extend along memory cell array 200, memory circuit 300 or 500. In some embodiments, memory cell array 200 is surrounded by two columns of strap cells.

In some embodiments, conductive structure 534a is electrically coupled to at least conductive structure 524a by via 538a. In some embodiments, conductive structure 534c is electrically coupled to at least conductive structure 524c by via 538c.

Other quantities or configurations of the set of conductive structures 534 or 536 are within the scope of the present disclosure.

Memory circuit 500 further includes one or more resistive switching elements 550a, 550c (hereinafter referred to as a "set of resistive switching elements 550".)

The set of resistive switching elements 550 are set of resistive switching elements 350 of FIG. 3. In some embodiments, resistive switching elements 550a, 550c are corresponding resistive switching elements 350a, 350c of FIG. 3. At least one of the set of resistive switching elements 550 is resistive switching element 104 of FIG. 1.

The set of resistive switching elements 550 is located on a seventh level. In some embodiments, the seventh level of memory circuit 500 is above the M3 level and below the M4 level. In some embodiments, the seventh level is positioned above at least the active region, the M0 level, the POLY level, the MD level, the M1 level, the M2 level or the M3 level of memory circuit 500.

Resistive switching elements 550a, 550c include corresponding bottom electrodes 552a, 552c (collectively referred to as a "set of bottom electrodes 552"), corresponding resistive switching materials 554a, 554c (collectively referred to as a "set of resistive switching material 554") and corresponding top electrodes 560a, 560c (collectively referred to as a "set of top electrodes 560.")

At least one of the bottom electrodes of the set of bottom electrodes 552 corresponds to the bottom electrode 104a of FIG. 1. Bottom electrodes 552a, 552c are above corresponding conductive structures 534a, 534c.

At least one of the resistive switching materials of the set of resistive switching materials 554 corresponds to resistive switching material 104a of FIG. 1. Resistive switching materials 554a, 554c overlap at least a portion of corresponding conductive structures 534a, 534c. Resistive switching materials 554a, 554c overlap corresponding bottom electrodes 552a, 552c. Resistive switching materials 554a, 554c are above corresponding bottom electrodes 552a, 552c.

At least one of the top electrodes of the set of top electrodes 560 corresponds to top electrode 104c of FIG. 1. Top electrodes 560a, 560c are above corresponding resistive switching materials 554a, 554c and corresponding bottom electrodes 552a, 552c.

Other configurations or quantities of elements in the set of resistive switching elements 550, set of bottom electrodes 552, set of resistive switching materials 554, set of top electrodes 560 are within the scope of the present disclosure.

Memory circuit 500 further includes one or more conductive structures 540a, 540b (hereinafter referred to as a "set of conductive structures 540") extending in the second direction Y.

The set of conductive structures 540 is located on an eighth level. In some embodiments, the eighth level of memory circuit 500 is metal four (M4). In some embodiments, the M4 level is positioned above at least the active region, the M0 level, the POLY level, the MD level, the M1 level, the M2 level or the M3 level of memory circuit 500.

Conductive structures 540a, 540b are corresponding bit lines BL1, BL2 of memory circuit 500. At least one conductive structure of the set of conductive structures 540 is bit line BL1 of FIG. 1. In some embodiments, conductive structure 540a is at least conductive structure 340a or 340b of FIG. 3. In some embodiments, conductive structure 540b is at least conductive structure 340c or 340d of FIG. 3. In some embodiments, conductive structures 540a, 540b are corresponding bit lines BL1, BL2 of FIG. 3.

Conductive structures 540a, 540b are above corresponding resistive switching elements 550a, 550c. Conductive structures 540a, 540b overlap corresponding resistive switching elements 550a, 550c. In some embodiments, set of conductive structures 540 is electrically coupled to the set of resistive switching elements 550. In some embodiments, conductive structures 540a, 540b is electrically coupled to corresponding top electrodes 560a, 560c. In some embodiments, set of conductive structures 540 is electrically coupled to the set of conductive structures 534 by the set of resistive switching elements 550. In some embodiments, conductive structures 540a, 540b is electrically coupled to corresponding conductive structures 534a, 534c by corresponding resistive switching elements 550a, 550c.

Other configurations or quantities of patterns in the set of conductive structures 540 are within the scope of the present disclosure.

Memory circuit 500 further includes one or more vias 572a, 572b, 572e, 572f (collectively referred to as a "set of vias 572"). In some embodiments, set of vias 572 electrically couple the set of conductive structures 540 to upper metal layers (e.g., M5). In some embodiments, set of vias 572 is in the V4 level of memory circuit 500. The V4 level of memory circuit 500 is between an eighth level and a ninth level of memory circuit 500. Other quantities or configurations of the set of vias 572 are within the scope of the present disclosure.

Memory circuit 500 further includes one or more conductive structures 570a, 570b (hereinafter referred to as a "set of conductive structures 570") extending in the second direction Y. The set of conductive structures 570 is located on a ninth level. In some embodiments, the ninth level of memory circuit 500 is metal five (M5). In some embodiments, the M5 level is positioned above at least the active region, the M0 level, the POLY level, the MD level, the M1 level, the M2 level, the M3 level or the M4 level of memory circuit 500.

In some embodiments, conductive structures 570a, 570b are corresponding bit lines BL1, BL2 of memory circuit 500. At least one conductive structure of the set of conductive structures 570 is bit line BL1 of FIG. 1. In some embodiments, conductive structures 570a, 570b are corresponding bit lines BL1, BL2 of FIG. 3.

In some embodiments, conductive structure 570a is electrically coupled to at least conductive structure 540a by at least via 572a or 572b.

In some embodiments, conductive structure 570b is electrically coupled to at least conductive structure 540b by at least via 572e or 572f.

In some embodiments, conductive structures 570a, 540a located on two different metal levels corresponds to bit line BL1 of memory circuit 300 or 500 or memory cell 100 of FIG. 1 resulting in less resistance than other approaches. In some embodiments, conductive structures 570b, 540b located on two different metal levels corresponds to bit line BL2 of memory circuit 300 or 500 or memory cell 100 of FIG. 1 resulting in less resistance than other approaches.

In some embodiments, a width of one of conductive structure 514e, 524e, 540a, 540b, 570a or 570b is the same as a width of another of conductive structure 514e, 524e, 540a, 540b, 570a or 570b. In some embodiments, a width of one of conductive structure 514e, 524e, 540a, 540b, 570a or 570b is different from a width of another of conductive structure 514e, 524e, 540a, 540b, 570a or 570b.

In some embodiments, a width of one of conductive structure 514e, 524e is the same as a width of one of conductive structure 540a, 540b, 570a or 570b resulting in less difference between the resistance of the bit lines BL1, BL2 and source lines SL1 compared with other approaches.

In some embodiments, memory circuit 500 includes a bit line BL1 (e.g., either conductive structure 540a or conductive structure 570a) positioned on a single metal level. In some embodiments, memory circuit 500 includes a bit line BL2 (e.g., either conductive structure 540b or conductive structure 570b) positioned on a single metal level.

Other configurations or quantities of patterns in the set of conductive structures 570 are within the scope of the present disclosure.

Method

Figure 6:
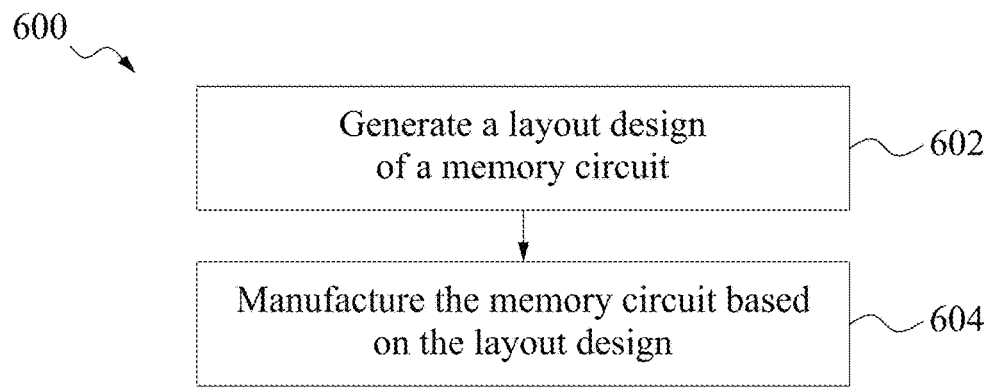
FIG. 6 is a flowchart of a method of forming or manufacturing a memory circuit in accordance with some embodiments.

FIG. 6 is a flowchart of a method 600 of forming or manufacturing a memory circuit in accordance with some embodiments. It is understood that additional operations may be performed before, during, and/or after the method 600A depicted in FIG. 6, and that some other operations may only be briefly described herein. In some embodiments, the method 600 is usable to form memory circuits, such as memory cell 100 (FIG. 1), memory cell array 200 (FIG. 2), memory circuit 300 (FIG. 3) or memory circuit 500 (FIGS. 5A-5E). In some embodiments, the method 600 is usable to form memory circuits having similar structural relationships as one or more of layout design 400 (FIGS. 4A-4H).

In operation 602 of method 600, a layout design 400 of a memory circuit (e.g., memory cell 100, memory cell array 200, memory circuit 300 or 500) is generated. Operation 602 is performed by a processing device (e.g., processor 802 (FIG. 8)) configured to execute instructions for generating a layout design 400. In some embodiments, the layout design 400 is a graphic database system (GDSII) file format.

In operation 604 of method 600, the memory circuit (e.g., memory cell 100, memory cell array 200, memory circuit 300 or 500) is manufactured based on layout design 400. In some embodiments, operation 604 of method 600 comprises manufacturing at least one mask based on the layout design 400, and manufacturing the memory circuit (e.g., memory cell 100, memory cell array 200, memory circuit 300 or 500) based on the at least one mask.

Figure 7:
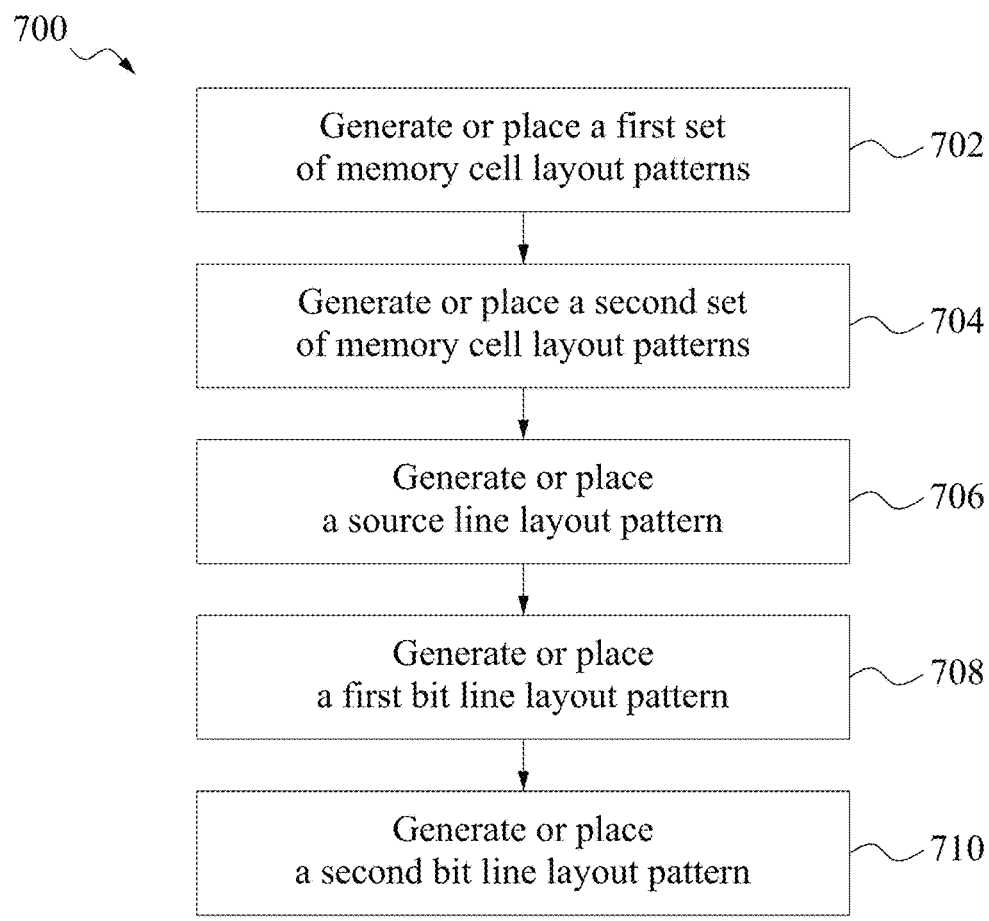
FIG. 7 is a flowchart of a method of generating a layout design of a memory circuit in accordance with some embodiments.

FIG. 7 is a flowchart of a method 700 of generating a layout design of a memory circuit in accordance with some embodiments. It is understood that additional operations may be performed before, during, and/or after the method 700 depicted in FIG. 7, and that some other processes may only be briefly described herein. In some embodiments, the method 700 is usable to generate one or more layout patterns of layout design 400 (FIGS. 4A-4H) of a memory circuit (e.g., memory cell 100, memory cell array 200, memory circuit 300 or 500).

In operation 702 of method 700, a first set of memory cell layout patterns (e.g., memory cell layout pattern 402[1,1] or 402[2,1]) is generated or placed on layout design 400. In some embodiments, the first set of memory cell layout patterns corresponds to fabricating a first set of memory cells (e.g., memory cells 302[1,1] or 302[2,1] or memory cell 502a) arranged in a first column (e.g., column 1) of memory cells. In some embodiments, each of the layout patterns of the first of memory cell layout patterns is separated from an adjacent layout pattern of the first set of memory cell layout patterns in second direction Y.

In some embodiments, operation 702 comprises at least operation 702a (not shown) or operation 702b (not shown).

In some embodiments, operation 702a comprises generating or placing a set of selector element layout patterns (e.g., selector element layout pattern 404a, 404b) on layout design 400. In some embodiments, selector element layout patterns layout patterns 404a, 404b,) correspond to fabricating selector elements 314a, 314b arranged in the first column (e.g., column 1) of memory cells. In some embodiments, each of the layout patterns of the set of selector element layout patterns is separated from an adjacent layout pattern of the set of selector element in the second direction Y and is located on a first set of layout levels (e.g., layout levels OD-M1).

In some embodiments, operation 702b comprises generating or placing a set of resistive switching element layout patterns (e.g., resistive switching element layout patterns 450a, 450b) on layout design 400. In some embodiments, set of resistive switching element layout patterns (e.g., resistive switching element layout patterns 450a, 450b) corresponds to fabricating a set of resistive switching elements 350 or 550 arranged in the first column (e.g., column 1) of memory cells. In some embodiments, each of the layout patterns of the set of resistive switching element layout patterns is separated from an adjacent layout pattern of the set of resistive switching element layout patterns in the second direction Y, and is located on a second set of layout levels (e.g., layout levels M3-M4) above the first set of layout levels.

In operation 704 of method 700, a second set of memory cell layout patterns (e.g., memory cell layout pattern 402[1,2] or 402[2,2]) is generated or placed on layout design 400. In some embodiments, the second set of memory cell layout patterns corresponds to fabricating a second set of memory cells (e.g., memory cells 302[1,2] or 302[2,2] or memory cell 502b) arranged in a second column (e.g., column 2) of memory cells. In some embodiments, each of the layout patterns of the second set of memory cell layout patterns is separated from an adjacent layout pattern of the second set of memory cell layout patterns in second direction Y.

In some embodiments, operation 704 comprises at least operation 704*a* (not shown) or operation 704*b* (not shown).

In some embodiments, operation 704*a* comprises generating or placing a set of selector element layout patterns (e.g., selector element layout pattern 404*c*, 404*d*) on layout design 400. In some embodiments, selector element layout patterns layout patterns 404*c*, 404*d*,) correspond to fabricating selector elements 314*c*, 314*d* arranged in the second column (e.g., column 2) of memory cells. In some embodiments, each of the layout patterns of the set of selector element layout patterns is separated from an adjacent layout pattern of the set of selector element in the second direction Y and is located on the first set of layout levels (e.g., layout levels OD-M1).

In some embodiments, operation 704*b* comprises generating or placing a set of resistive switching element layout patterns (e.g., resistive switching element layout patterns 450*c*, 450*d*) on layout design 400. In some embodiments, set of resistive switching element layout patterns (e.g., resistive switching element layout patterns 450*c*, 450*d*) corresponds to fabricating a set of resistive switching elements 350 or 550 arranged in the second column (e.g., column 2) of memory cells. In some embodiments, each of the layout patterns of the set of resistive switching element layout patterns is separated from an adjacent layout pattern of the set of resistive switching element layout patterns in the second direction Y, and is located on the second set of layout levels (e.g., layout levels M3-M4).

In some embodiments, at least operation 702*b* or 704*b* comprises at least operation 705*a* (not shown), operation 705*b* (not shown) or operation 705*c* (not shown).

In some embodiments, operation 705*a* comprises generating or placing a bottom electrode element layout pattern 452*a*, 452*b*, 452*c* or 452*d* on layout level BE. In some embodiments, bottom electrode element layout pattern 452*a*, 452*b*, 452*c* or 452*d* corresponds to fabricating bottom electrode element 104*a*, 552*a* or 552*c*.

In some embodiments, operation 705*b* comprises generating or placing a resistive switching material layout pattern 454*a*, 454*b*, 454*c* or 454*d* on layout level TMO. In some embodiments, resistive switching material layout pattern 454*a*, 454*b*, 454*c* or 454*d* corresponds to fabricating resistive switching material 104*b*, 554*a* or 554*c*.

In some embodiments, operation 705*c* comprises generating or placing a top electrode element layout pattern 460*a*, 460*b*, 460*c* or 460*d* on layout level TE. In some embodiments, top electrode element layout pattern 452*a*, 452*b*, 452*c* or 452*d* corresponds to fabricating top electrode element 104*c*, 560*a* or 560*c*.

In some embodiments, operation 706 comprises generating or placing a source line layout pattern (e.g., at least conductive feature layout pattern 414*e* or 424*e*) on layout design 400.

In some embodiments, operation 706 comprises at least operation 706*a* (not shown).

In some embodiments, operation 706*a* comprises generating or placing a first set of conductive feature layout patterns (e.g., conductive feature layout pattern 414*e*) extending in the second direction Y. In some embodiments, conductive feature layout pattern 414*e* is positioned between the first set of memory cell layout patterns and the second set of memory cell layout patterns. In some embodiments, the first set of conductive feature layout patterns (e.g., conductive feature layout pattern 414*e*) corresponds to fabricating a source line SL1 in FIGS. 1-3 and 5 that extends in the second direction Y and is coupled to the first set of memory cells and the second set of memory cells. In some embodiments, the first set of conductive feature layout patterns (e.g., conductive feature layout pattern 414*e*) is located on the M1 layout level.

In some embodiments, operation 706 further comprises at least operation 706*b* (not shown) or operation 706*c* (not shown).

In some embodiments, operation 706*b* comprises generating or placing a second set of conductive feature layout patterns (e.g., conductive feature layout pattern 424*e*) extending in the second direction Y. In some embodiments, conductive feature layout pattern 424*e* is positioned between the first set of memory cell layout patterns and the second set of memory cell layout patterns. In some embodiments, the second set of conductive feature layout patterns (e.g., conductive feature layout pattern 424*e*) corresponds to fabricating source line SL1 in FIGS. 1-3 and 5 that extends in the second direction Y and is coupled to the first set of memory cells and the second set of memory cells. In some embodiments, the second set of conductive feature layout patterns (e.g., conductive feature layout pattern 424*e*) is located on the M2 layout level different from the M1 layout level.

In some embodiments, operation 706*c* comprises generating or placing a set of via layout patterns (e.g., set of via layout patterns 422) on layout design 400. In some embodiments, the set of via layout patterns is located between the M1 layout level and the M2 layout level. In some embodiments, the set of via layout patterns (e.g., set of via layout patterns 422) corresponds to fabricating a set of vias 522 coupled between the source line SL1 and another portion of the source line SL1. In some embodiments, set of vias 522 are coupled between conductive feature layout pattern 424*e* and conductive feature layout pattern 414*e*.

In some embodiments, operation 708 comprises generating or placing a first bit line layout pattern (e.g., at least conductive feature layout pattern 440*a*) on layout design 400.

In some embodiments, operation 708 comprises at least operation 708*a* (not shown).

In some embodiments, operation 708*a* comprises generating or placing a third set of conductive feature layout patterns (e.g., conductive feature layout pattern 440*a*) extending in the second direction Y. In some embodiments, the third set of conductive feature layout patterns (e.g., conductive feature layout pattern 440*a*) is located on a M4 layout level. In some embodiments, the third set of conductive feature layout patterns (e.g., conductive feature layout pattern 440*a*) corresponds to fabricating a first portion (e.g., 540*a*) of a first bit line BL1 coupled to the first set of memory cells.

In some embodiments, operation 708 further comprises at least operation 708*b* or 708*c*.

In some embodiments, operation 708*a* comprises generating or placing a fourth set of conductive feature layout patterns (e.g., conductive feature layout pattern 470*a*) extending in the second direction Y. In some embodiments, the fourth set of conductive feature layout patterns (e.g., conductive feature layout pattern 470*a*) is located on a M5 layout level. In some embodiments, the fourth set of conductive feature layout patterns (e.g., conductive feature layout pattern 470*a*) corresponds to fabricating a second portion (e.g., 570*a*) of the first bit line BL1 coupled to the first set of memory cells.

In some embodiments, operation 708*b* comprises generating or placing a set of via layout patterns (e.g., via layout patterns 472*a*, 427*b*, 472*c*, 472*d*) between the third set of conductive feature layout patterns (e.g., conductive feature layout pattern 470a) and the fourth set of conductive feature layout patterns (e.g., conductive feature layout pattern 440a). In some embodiments, the set of via layout patterns (e.g., via layout patterns 472a, 427b, 472c, 472d) corresponds to fabricating vias 572a, 572b coupled between the first portion of the first bit line BL1 and the second portion of the first bit line BL1.

In some embodiments, operation 710 comprises generating or placing a second bit line layout pattern (e.g., at least conductive feature layout pattern 440b) on layout design 400.

In some embodiments, operation 710 comprises at least operation 710a (not shown).

In some embodiments, operation 710a comprises generating or placing a fifth set of conductive feature layout patterns (e.g., conductive feature layout pattern 440c) extending in the second direction Y. In some embodiments, the fifth set of conductive feature layout patterns (e.g., conductive feature layout pattern 440c) is located on the M4 layout level. In some embodiments, the fifth set of conductive feature layout patterns (e.g., conductive feature layout pattern 440c) corresponds to fabricating a first portion (e.g., 540b) of a second bit line BL2 coupled to the second set of memory cells.

In some embodiments, operation 710 further comprises at least operation 710b or 710c.

In some embodiments, operation 710a comprises generating or placing a sixth set of conductive feature layout patterns (e.g., conductive feature layout pattern 470b) extending in the second direction Y. In some embodiments, the sixth set of conductive feature layout patterns (e.g., conductive feature layout pattern 470b) is located on the M5 layout level. In some embodiments, the sixth set of conductive feature layout patterns (e.g., conductive feature layout pattern 470b) corresponds to fabricating a second portion (e.g., 570b) of the second bit line BL2 coupled to the second set of memory cells.

In some embodiments, operation 710b comprises generating or placing a set of via layout patterns (e.g., via layout patterns 472e, 427f, 472g, 472h) between the sixth set of conductive feature layout patterns (e.g., conductive feature layout pattern 470b) and the fifth set of conductive feature layout patterns (e.g., conductive feature layout pattern 440b). In some embodiments, the set of via layout patterns (e.g., via layout patterns 472e, 427f, 472g, 472h) corresponds to fabricating vias 572e, 572f coupled between the first portion of the second bit line BL2 and the second portion of the second bit line BL2.

In some embodiments, layout design 400 is a standard cell. In some embodiments, one or more of operations 702, 704, 706, 708 or 710 is not performed.

One or more of the operations of methods 600-700 is performed by a processing device configured to execute instructions for manufacturing a memory circuit, such as memory circuit 100, 300 or 500, or a memory array, such as memory array 200. In some embodiments, one or more operations of methods 600-700 is performed using a same processing device as that used in a different one or more operations of methods 600-700. In some embodiments, a different processing device is used to perform one or more operations of methods 600-700 from that used to perform a different one or more operations of methods 600-700.

Figure 8:
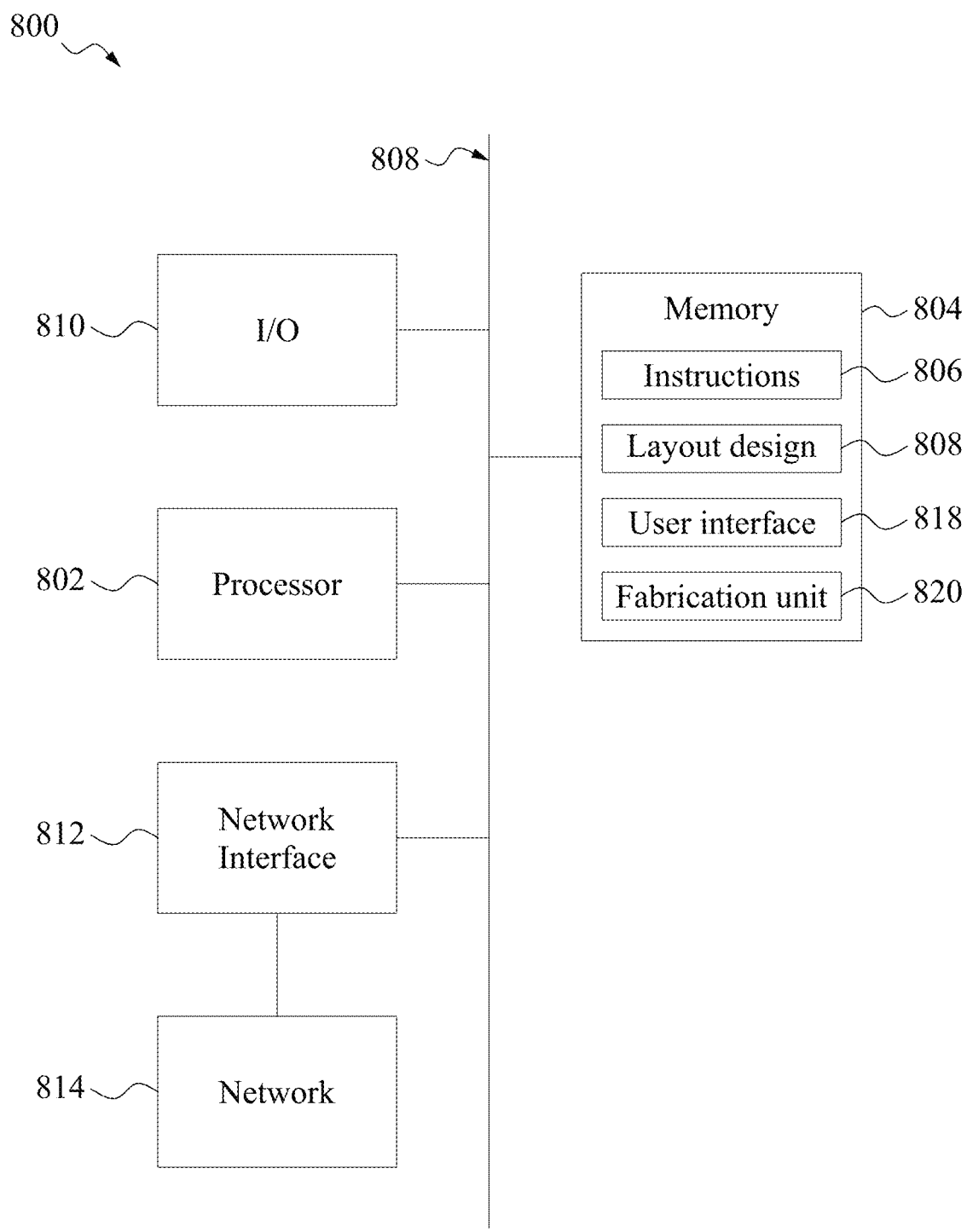
FIG. 8 is a schematic view of a system for designing an IC layout design in accordance with some embodiments.

FIG. 8 is a schematic view of a system 800 for designing an IC layout design in accordance with some embodiments. In some embodiments, system 800 generates or places one or more IC layout designs described herein. System 800 includes a hardware processor 802 and a non-transitory, computer readable storage medium 804 encoded with, i.e., storing, the computer program code 806, i.e., a set of executable instructions. Computer readable storage medium 804 is configured for interfacing with manufacturing machines for producing the integrated circuit. The processor 802 is electrically coupled to the computer readable storage medium 804 via a bus 808. The processor 802 is also electrically coupled to an I/O interface 810 by bus 808. A network interface 812 is also electrically connected to the processor 802 via bus 808. Network interface 812 is connected to a network 814, so that processor 802 and computer readable storage medium 804 are capable of connecting to external elements via network 814.

The processor 802 is configured to execute the computer program code 806 encoded in the computer readable storage medium 804 in order to cause system 800 to be usable for performing a portion or all of the operations as described in method 600 or 700.

In some embodiments, the processor 802 is a central processing unit (CPU), a multi-processor, a distributed processing system, an application specific integrated circuit (ASIC), and/or a suitable processing unit.

In some embodiments, the computer readable storage medium 804 is an electronic, magnetic, optical, electromagnetic, infrared, and/or a semiconductor system (or apparatus or device). For example, the computer readable storage medium 804 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 804 includes a compact disk-read only memory (CD-ROM), a compact disk-read/write (CD-R/W), and/or a digital video disc (DVD).

In some embodiments, the storage medium 804 stores the computer program code 806 configured to cause system 800 to perform method 600 or 700. In some embodiments, the storage medium 804 also stores information needed for performing method 600 or 700 as well as information generated during performing method 600 or 700, such as layout design 816 and user interface 818, and/or a set of executable instructions to perform the operation of method 600 or 700. In some embodiments, layout design 816 comprises one or more of layout patterns of layout design 400.

In some embodiments, the storage medium 804 stores instructions (e.g., computer program code 806) for interfacing with manufacturing machines. The instructions (e.g., computer program code 806) enable processor 802 to generate manufacturing instructions readable by the manufacturing machines to effectively implement method 600 or 700 during a manufacturing process.

System 800 includes I/O interface 810. I/O interface 810 is coupled to external circuitry. In some embodiments, I/O interface 810 includes a keyboard, keypad, mouse, trackball, trackpad, and/or cursor direction keys for communicating information and commands to processor 802.

System 800 also includes network interface 812 coupled to the processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interface such as ETHERNET, USB, or IEEE-1394. In some embodiments, method 600 or 700 is implemented in two or more systems 800, and information such as layout design, and user interface are exchanged between different systems 800 by network 814.

System 800 is configured to receive information related to a layout design through I/O interface 810 or network interface 812. The information is transferred to processor 802 by bus 808 to determine a layout design for producing IC 100A-100B or 400. The layout design is then stored in computer readable medium 804 as layout design 816. System 800 is configured to receive information related to a user interface through I/O interface 810 or network interface 812. The information is stored in computer readable medium 804 as user interface 818.

In some embodiments, method 600 or 700 is implemented as a standalone software application for execution by a processor. In some embodiments, method 600 or 700 is implemented as a software application that is a part of an additional software application. In some embodiments, method 600 or 700 is implemented as a plug-in to a software application. In some embodiments, method 600 or 700 is implemented as a software application that is a portion of an EDA tool. In some embodiments, method 600 or 700 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 600 or 700 is implemented by a manufacturing device to manufacture an integrated circuit using a set of masks manufactured based on one or more layout designs generated by system 800. In some embodiments, system 800 a manufacturing device to manufacture an integrated circuit using a set of masks manufactured based on one or more layout designs of the present disclosure. In some embodiments, system 800 of FIG. 8 generates layout designs of an integrated circuit that are smaller than other approaches. In some embodiments, system 800 of FIG. 8 generates layout designs of integrated circuit structure that occupy less area and provide better routing resources than other approaches.

Figure 9:
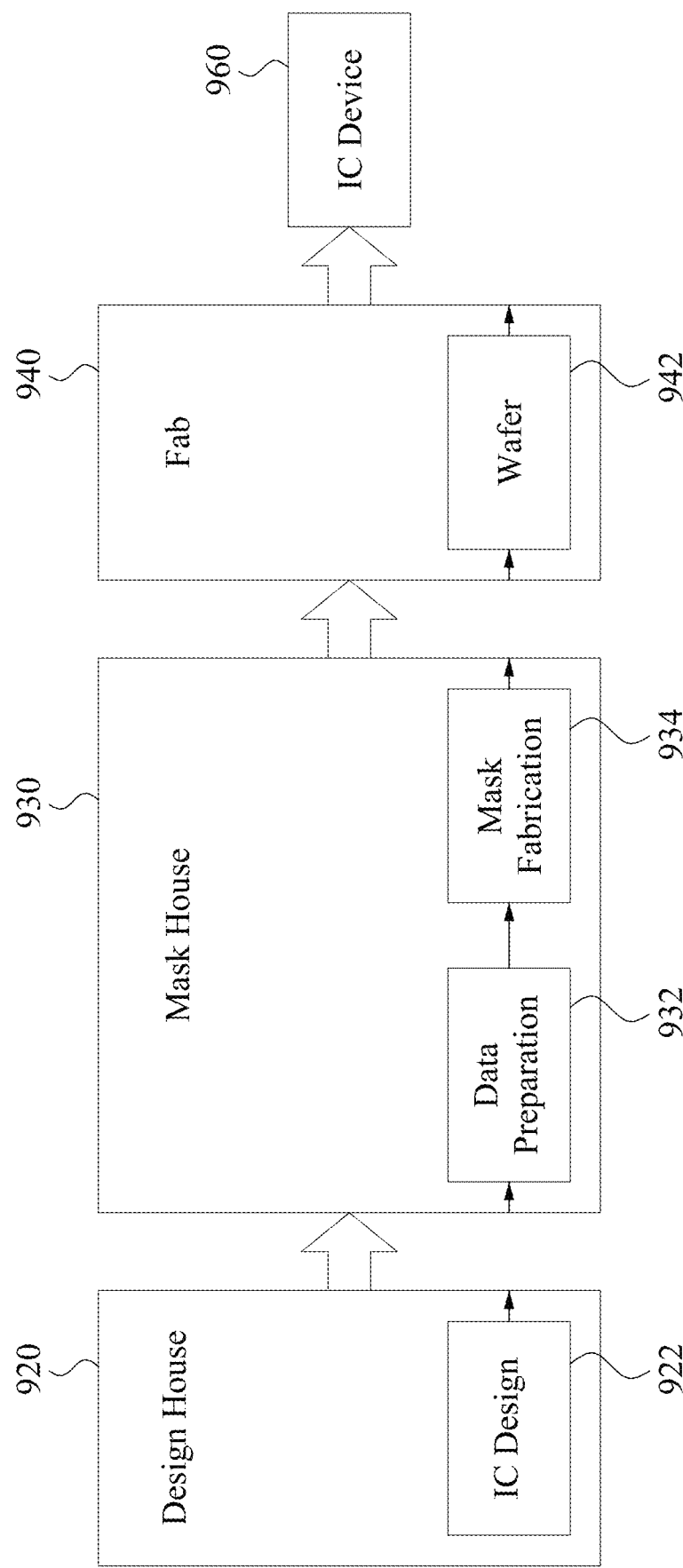
FIG. 9 is a block diagram of an IC manufacturing system, and an IC manufacturing flow associated therewith, in accordance with at least one embodiment of the present disclosure.

FIG. 9 is a block diagram of an integrated circuit (IC) manufacturing system 900, and an IC manufacturing flow associated therewith, in accordance with at least one embodiment of the present disclosure.

In FIG. 9, IC manufacturing system 900 includes entities, such as a design house 920, a mask house 940, and an IC manufacturer/fabricator ("fab") 940, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 920, mask house 940, and IC fab 940 is owned by a single larger company. In some embodiments, two or more of design house 920, mask house 940, and IC fab 940 coexist in a common facility and use common resources.

Design house (or design team) 920 generates an IC design layout 922. IC design layout 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout 922 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 920 implements a proper design procedure to form IC design layout 922. The design procedure includes one or more of logic design, physical design or place and route. IC design layout 922 is presented in one or more data files having information of the geometrical patterns. For example, IC design layout 922 can be expressed in a GDSII file format or DFII file format.

Mask house 940 includes data preparation 952 and mask fabrication 944. Mask house 940 uses IC design layout 922 to manufacture one or more masks to be used for fabricating the various layers of IC device 960 according to IC design layout 922. Mask house 940 performs mask data preparation 952, where IC design layout 922 is translated into a representative data file ("RDF"). Mask data preparation 952 provides the RDF to mask fabrication 944. Mask fabrication 944 includes a mask writer. A mask writer converts the RDF to an image on a substrate, such as a mask (reticle) or a semiconductor wafer. The design layout is manipulated by mask data preparation 952 to comply with particular characteristics of the mask writer and/or requirements of IC fab 940. In FIG. 9, mask data preparation 952 and mask fabrication 944 are illustrated as separate elements. In some embodiments, mask data preparation 952 and mask fabrication 944 can be collectively referred to as mask data preparation.

In some embodiments, mask data preparation 952 includes optical proximity correction (OPC) which uses lithography enhancement techniques to compensate for image errors, such as those that can arise from diffraction, interference, other process effects and the like. OPC adjusts IC design layout 922. In some embodiments, mask data preparation 952 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 952 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 944, which may undo part of the modifications performed by OPC in order to meet mask creation rules.

In some embodiments, mask data preparation 952 includes lithography process checking (LPC) that simulates processing that will be implemented by IC fab 940 to fabricate IC device 960. LPC simulates this processing based on IC design layout 922 to create a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 922.

It should be understood that the above description of mask data preparation 952 has been simplified for the purposes of clarity. In some embodiments, data preparation 952 includes additional features such as a logic operation (LOP) to modify the IC design layout according to manufacturing rules. Additionally, the processes applied to IC design layout 922 during data preparation 952 may be executed in a variety of different orders.

After mask data preparation 952 and during mask fabrication 944, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 944 is used in a variety of processes. For example, such a mask(s) is used in an ion implantation process to form various doped regions in the semiconductor wafer, in an etching process to form various etching regions in the semiconductor wafer, and/or in other suitable processes.

IC fab 940 is an IC fabrication business that includes one or more manufacturing facilities for the fabrication of a variety of different IC products. In some embodiments, IC Fab 940 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 940 uses the mask (or masks) fabricated by mask house 940 to fabricate IC device 960. Thus, IC fab 940 at least indirectly uses IC design layout 922 to fabricate IC device 960. In some embodiments, a semiconductor wafer 952 is fabricated by IC fab 940 using the mask (or masks) to form IC device 960. Semiconductor wafer 952 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an integrated circuit (IC) manufacturing system (e.g., system 900 of FIG. 9), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a memory cell array. In some embodiments, the memory cell array includes a first column of memory cells. In some embodiments, the memory cell array further includes a second column of memory cells being separated from the first column of memory cells in a first direction, the first column of memory cells and the second column of memory cells being arranged in a second direction different from the first direction. In some embodiments, the memory cell array further includes a first bit line coupled to the first column of memory cells, and extending in the second direction. In some embodiments, the memory cell array further includes a second bit line coupled to the second column of memory cells, and extending in the second direction. In some embodiments, the second bit line includes a first conductive line extending in the second direction, and being located on a first metal layer. In some embodiments, the first bit line or the second bit line further includes a second conductive line extending in the second direction, and being located on a second metal layer above the first metal layer, the first conductive line and the second conductive line overlap a source of a transistor of a memory cell of the second column of memory cells. In some embodiments, the memory cell array further includes a source line extending in the second direction, being coupled to the first column of memory cells and the second column of memory cells. In some embodiments, the memory cell array further includes a first set of vias electrically coupled to the first conductive line and the second conductive line, and being between the first conductive line and the second conductive line, a pair of vias of the first set of vias being located above where the first conductive line overlaps each memory cell of the second column of memory cells.

Another aspect of this description relates to a memory cell array. In some embodiments, the memory cell array includes a first column of resistance random access memory (RRAM) cells. In some embodiments, the memory cell array further includes a second column of RRAM cells being separated from the first column of RRAM cells in a first direction, the first column of RRAM cells and the second column of RRAM cells being arranged in a second direction different from the first direction. In some embodiments, the memory cell array further includes a first bit line coupled to the first column of RRAM cells, and extending in the second direction. In some embodiments, the first bit line includes a first conductive line extending in the second direction, and being located on a first metal layer. In some embodiments, the first bit line further includes a second conductive line extending in the second direction, and being located on a second metal layer above the first metal layer, the first conductive line and the second conductive line overlapping a source of a transistor of a memory cell of the first column of RRAM cells. In some embodiments, the memory cell array further includes a source line extending in the second direction, being coupled to the first column of RRAM cells and the second column of RRAM cells. In some embodiments, the memory cell array further includes a first set of vias electrically coupled to the first conductive line and the second conductive line, and being between the first conductive line and the second conductive line, a pair of vias of the first set of vias being located above where the first conductive line overlaps each RRAM cell of the first column of RRAM cells.

Still another aspect of this description relates to a memory cell array. In some embodiments, the memory cell array includes a first row of memory cells. In some embodiments, the first row includes a first memory cell, and a second memory cell separated from the first memory cell in a first direction. In some embodiments, the memory cell array further includes a word line extending in the first direction, and being coupled to the first memory cell and the second memory cell. In some embodiments, the memory cell array further includes a first bit line coupled to the first memory cell, and extending in a second direction different from the first direction. In some embodiments, the first bit line includes a first conductive line extending in the second direction, and being located on a first metal layer. In some embodiments, the first bit line further includes a second conductive line extending in the second direction, and being located on a second metal layer above the first metal layer, the first conductive line and the second conductive line overlap a source of a transistor of the first memory cell. In some embodiments, the memory cell array further includes a second bit line coupled to the second memory cell, and extending in the second direction. In some embodiments, the memory cell array further includes a source line extending in the second direction, and being coupled to the first memory cell and the second memory cell. In some embodiments, the memory cell array further includes a first pair of vias electrically coupled to the first conductive line and the second conductive line, being between the first conductive line and the second conductive line, and being located above where the first conductive line overlaps the first memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell array comprising:
   a first column of memory cells;
   a second column of memory cells being separated from the first column of memory cells in a first direction, the first column of memory cells and the second column of memory cells being arranged in a second direction different from the first direction;
   a first bit line coupled to the first column of memory cells, and extending in the second direction;
   a second bit line coupled to the second column of memory cells, and extending in the second direction, the second bit line comprises:
      a first conductive line extending in the second direction, and being located on a first metal layer; and
      a second conductive line extending in the second direction, and being located on a second metal layer above the first metal layer, the first conductive line and the second conductive line overlap a source of a transistor of a memory cell of the second column of memory cells;
   a source line extending in the second direction, being coupled to the first column of memory cells and the second column of memory cells; and
   a first set of vias electrically coupled to the first conductive line and the second conductive line, and being between the first conductive line and the second conductive line, a pair of vias of the first set of vias being located above where the first conductive line overlaps each memory cell of the second column of memory cells.

2. The memory cell array of claim 1, wherein each memory cell of the first column of memory cells or the second column of memory cells is a non-volatile memory cell.

3. The memory cell array of claim 2, wherein the non-volatile memory cell includes one or more of a ferroelectric RAM (FRAM) or a Magnetoresistive RAM (MRAM).

4. The memory cell array of claim 1, wherein a resistance of the first bit line or a resistance of the second bit line is substantially equal to a resistance of the source line.

5. The memory cell array of claim 1, wherein the source line comprises:
   a third conductive line extending in the second direction, and being located on a third metal layer below the first metal layer.

6. The memory cell array of claim 5, wherein the source line further comprises:
   a fourth conductive line extending in the second direction, and being located on a fourth metal layer above the third metal layer and below the first metal layer; and
   a second set of vias electrically coupled to the third conductive line and the fourth conductive line, and being located between the third conductive line and the fourth conductive line.

7. The memory cell array of claim 6, wherein the third metal layer is a metal 1 (M1) layer, and the fourth metal layer is a metal 2 (M2) layer.

8. The memory cell array of claim 1, wherein the first metal layer is a metal 4 (M4) layer, and the second metal layer is a metal 5 (M5) layer.

9. The memory cell array of claim 1, wherein a length of the first conductive line is substantially equal to a length of the second conductive line.

10. A memory cell array comprising:
    a first column of resistance random access memory (RRAM) cells;
    a second column of RRAM cells being separated from the first column of RRAM cells in a first direction, the first column of RRAM cells and the second column of RRAM cells being arranged in a second direction different from the first direction;
    a first bit line coupled to the first column of RRAM cells, and extending in the second direction, the first bit line comprising:

a first conductive line extending in the second direction, and being located on a first metal layer; and a second conductive line extending in the second direction, and being located on a second metal layer above the first metal layer, the first conductive line and the second conductive line overlapping a source of a transistor of a memory cell of the first column of RRAM cells;

a source line extending in the second direction, being coupled to the first column of RRAM cells and the second column of RRAM cells; and a first set of vias electrically coupled to the first conductive line and the second conductive line, and being between the first conductive line and the second conductive line, a pair of vias of the first set of vias being located above where the first conductive line overlaps each RRAM cell of the first column of RRAM cells.

11. The memory cell array of claim 10, wherein a length of the first conductive line is substantially equal to a length of the second conductive line.

12. The memory cell array of claim 10, wherein the source line comprises:
a third conductive line extending in the second direction, and being located on a third metal layer below the first metal layer; and
a fourth conductive line extending in the second direction, and being located on a fourth metal layer above the third metal layer and below the first metal layer.

13. The memory cell array of claim 12, wherein the source line further comprises:
a second set of vias electrically coupled to the third conductive line and the fourth conductive line, and being located between the third conductive line and the fourth conductive line.

14. The memory cell array of claim 12, wherein the third metal layer is a metal 1 (M1) layer, and the fourth metal layer is a metal 2 (M2) layer.

15. The memory cell array of claim 10, wherein the first metal layer is a metal 4 (M4) layer, and the second metal layer is a metal 5 (M5) layer.

16. The memory cell array of claim 10, wherein each RRAM cell of the first column of RRAM cells or the second column of RRAM cells comprises:
a resistance switching element coupled to the first bit line; and
a switch coupled between the resistance switching element and the source line.

17. A memory cell array comprising:
a first row of memory cells, the first row including:
a first memory cell; and
a second memory cell separated from the first memory cell in a first direction;
a second row of memory cells, the second row comprising:
a third memory cell separated from the first memory cell in a second direction different from the first direction;
a first column of memory cells comprising:
the first memory cell; and
the third memory cell;
a word line extending in the first direction, and being coupled to the first memory cell and the second memory cell;
a first bit line coupled to the first memory cell and the third memory cell, and extending in the second direction, the first bit line comprising:
a first conductive line extending in the second direction, and being located on a first metal layer; and
a second conductive line extending in the second direction, and being located on a second metal layer above the first metal layer, the first conductive line and the second conductive line overlap a source of a transistor of the first memory cell;
a second bit line coupled to the second memory cell, and extending in the second direction;
a source line extending in the second direction, and being coupled to the first memory cell and the second memory cell; and
pairs of vias electrically coupled to the first conductive line and the second conductive line, being between the first conductive line and the second conductive line, and each pair of vias of the pairs of vias being located above where the first conductive line overlaps each corresponding memory cell in the first column of memory cells.

18. The memory cell array of claim 17, wherein the second bit line comprises:
a third conductive line extending in the second direction, and being located on the first metal layer; and
a fourth conductive line extending in the second direction, and being located on the second metal layer, the third conductive line and the fourth conductive line overlap a source of a transistor of the second memory cell.

19. The memory cell array of claim 18, wherein the second bit line further comprises:
a second pair of vias electrically coupled to the third conductive line and the fourth conductive line, being between the third conductive line and the fourth conductive line, and being located above where the third conductive line overlaps the second memory cell.

20. The memory cell array of claim 17, wherein a width of the first bit line or a width of the second bit line is substantially equal to a width of the source line.

* * * * *